United States Patent
Chen et al.

(10) Patent No.: US 12,373,075 B2
(45) Date of Patent: Jul. 29, 2025

(54) TOUCH DISPLAY MODULE AND TOUCH DISPLAY DEVICE

(71) Applicant: Xiamen Tianma Microelectronics Co., Ltd., Xiamen (CN)

(72) Inventors: Lihong Chen, Xiamen (CN); Liting Fang, Xiamen (CN); Ling Wu, Xiamen (CN); Poping Shen, Xiamen (CN)

(73) Assignee: Xiamen Tianma Microelectronics Co., Ltd., Xiamen (CN)

( * ) Notice: Subject to any disclaimer, the term of this patent is extended or adjusted under 35 U.S.C. 154(b) by 0 days.

(21) Appl. No.: 18/738,568

(22) Filed: Jun. 10, 2024

(65) Prior Publication Data

US 2024/0329789 A1    Oct. 3, 2024

(30) Foreign Application Priority Data

Nov. 14, 2023   (CN) .......................... 202311516400.3

(51) Int. Cl.
| | |
|---|---|
| G06F 3/041 | (2006.01) |
| G06F 3/045 | (2006.01) |
| G02F 1/1333 | (2006.01) |
| G02F 1/1335 | (2006.01) |
| H10K 59/40 | (2023.01) |
| H10K 59/80 | (2023.01) |

(52) U.S. Cl.
CPC ............ *G06F 3/045* (2013.01); *G06F 3/0412* (2013.01); *G02F 1/13338* (2013.01); *G02F 1/133528* (2013.01); *G06F 2203/04103* (2013.01); *H10K 59/40* (2023.02); *H10K 59/8791* (2023.02)

(58) Field of Classification Search
None
See application file for complete search history.

(56) References Cited

U.S. PATENT DOCUMENTS

2012/0049147 A1    3/2012   Hong

FOREIGN PATENT DOCUMENTS

| CN | 109116607 A | * | 1/2019 | ........... G02F 1/1333 |
|---|---|---|---|---|
| CN | 109935386 A | | 6/2019 | |
| CN | 110082949 A | | 8/2019 | |

OTHER PUBLICATIONS

Translation of CN-109116607-A into English, You et al. (Year: 2019).*

* cited by examiner

*Primary Examiner* — Brian M Butcher
(74) *Attorney, Agent, or Firm* — KDW Firm PLLC

(57) ABSTRACT

Provided are a touch display module and a touch display device. The touch display module includes a touch display panel and an impedance structure and a polarizer that are sequentially disposed on a light emission side of the touch display panel. The impedance structure includes a first impedance layer and a second impedance layer. The first impedance layer is located on a side of the second impedance layer facing away from the touch display panel. A sheet resistance of the first impedance layer is greater than a sheet resistance of the second impedance layer.

20 Claims, 9 Drawing Sheets

Prepare a touch display panel — S110

Prepare an impedance structure on a light emission side of the touch display panel, where the impedance structure includes a first impedance layer and a second impedance layer, the first impedance layer is located on a side of the second impedance layer facing away from the touch display panel, and a sheet resistance of the first impedance layer is greater than a sheet resistance of the second impedance layer — S120

Prepare a polarizer on a side of the impedance structure facing away from the touch display panel — S130

TOUCH DISPLAY MODULE AND TOUCH DISPLAY DEVICE

CROSS-REFERENCE TO RELATED APPLICATION(S)

This application claims priority to Chinese Patent Application No. 202311516400.3 filed with the China National Intellectual Property Administration (CNIPA) on Nov. 14, 2023, the disclosure of which is incorporated herein by reference in its entirety.

TECHNICAL FIELD

The present disclosure relates to the field of display panel technologies and, in particular, a touch display module and a touch display device.

BACKGROUND

With the continuous development of display technologies, display panels have been widely applied to people's production and life, and a display panel having a touch function is more widely applied. However, the display panels in the related art still have some requirements to be urgently resolved, for example, how to better ensure the touch effect of a touch display panel.

SUMMARY

Embodiments of the present disclosure provide a touch display module, a preparation method thereof and a touch display device. An impedance structure is adjusted to a multilayer structure and a sheet resistance of a first impedance layer is adjusted to be greater than a sheet resistance of a second impedance layer so that the touch sensitivity and the touch effect of the touch display module can be ensured.

An embodiment of the present disclosure provides a touch display module. The touch display module includes a touch display panel and an impedance structure and a polarizer that are sequentially disposed on a light emission side of the touch display panel.

The impedance structure includes a first impedance layer and a second impedance layer, the first impedance layer is located on a side of the second impedance layer facing away from the touch display panel, and a sheet resistance of the first impedance layer is greater than a sheet resistance of the second impedance layer.

An embodiment of the present disclosure provides a preparation method for a touch display module. The method includes the steps below.

A touch display panel is prepared.

An impedance structure is prepared on a light emission side of the touch display panel, where the impedance structure includes a first impedance layer and a second impedance layer, the first impedance layer is located on a side of the second impedance layer facing away from the touch display panel, and a sheet resistance of the first impedance layer is greater than a sheet resistance of the second impedance layer.

A polarizer is prepared on a side of the impedance structure facing away from the touch display panel.

An embodiment of the present disclosure provides a touch display device including a touch display module. The touch display module includes a touch display panel, and an impedance structure and a polarizer that are sequentially disposed on a light emission side of the touch display panel, the impedance structure comprises a first impedance layer and a second impedance layer, the first impedance layer is located on a side of the second impedance layer facing away from the touch display panel, and a sheet resistance of the first impedance layer is greater than a sheet resistance of the second impedance layer.

BRIEF DESCRIPTION OF DRAWINGS

To illustrate the technical solutions of embodiments of the present disclosure more clearly, the drawings used in the description of the embodiments are briefly described below. Apparently, the drawings described below merely illustrate part of the embodiments of the present disclosure, and those of ordinary skill in the art may obtain other drawings based on the drawings described below on the premise that no creative work is done.

DETAILED DESCRIPTION

To make the solutions of the present disclosure better understood by those skilled in the art, the technical solutions of the embodiments of the present disclosure are described below clearly and completely in conjunction with the drawings in the embodiments of the present disclosure. Apparently, the embodiments described below are part, not all, of the embodiments of the present disclosure. Based on the embodiments of the present disclosure, all other embodiments obtained by those of ordinary skill in the art are within the scope of the present disclosure on the premise that no creative work is done.

It is to be noted that terms such as "first" and "second" in the description, claims and drawings of the present disclosure are used for distinguishing between similar objects and are not necessarily used for describing a particular order or sequence. It is to be understood that the data used in this manner is interchangeable in appropriate cases so that the embodiments of the present disclosure described herein can be implemented in an order not illustrated or described herein. In addition, terms such as "comprising", "including" and any other variations thereof are intended to encompass a non-exclusive inclusion. For example, a system, product, or device that includes a series of units not only includes the expressly listed steps or units but may also include other units that are not expressly listed or are inherent to such a product or device.

Figure 1:
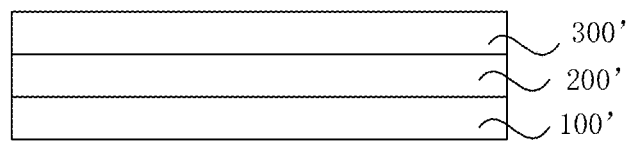
FIG. 1 is a diagram illustrating the structure of a touch display module according to the related art.

FIG. 1 is a diagram illustrating the structure of a touch display module according to the related art. Referring to FIG. 1, the touch display module 10' includes a touch display panel 100' and an impedance film 200' and a polarizer 300' that are on a light emission side of the touch display panel 100'. The impedance film 200' is generally a transparent thin film composed of metal oxide. When the impedance film 200' is exposed to a high temperature or high-intensity sunlight, oxygen within the impedance film 200' is prone to react with the polarizer 300' at the interface, thereby causing an oxygen loss of the impedance film 200', generating an oxygen vacancy and reducing the resistance value of the impedance film 200'. As a result, touch signals of the entire touch display module 10' are reduced, thereby affecting the touch effect of the touch display module 10'.

Based on the preceding technical problems, an embodiment of the present disclosure provides a touch display module. The touch display module includes a touch display panel and an impedance structure and a polarizer that are sequentially disposed on a light emission side of the touch display panel. The impedance structure includes a first impedance layer and a second impedance layer. The first impedance layer is located on a side of the second impedance layer facing away from the touch display panel. A sheet resistance of the first impedance layer is greater than a sheet resistance of the second impedance layer. With the arrangement of the impedance structure with multiple layers, compared with only one impedance layer in the related art, the resistance value is decreased due to reactions between the impedance layer and the upper film, so touch precision and electrostatic conduction cannot be considered at the same time. In the embodiments of the present disclosure, the first impedance layer is located between a main touch body and the touch display module. The main touch body and the touch display module are equivalent to one capacitance substrate. The first impedance layer may be understood as a dielectric layer in the capacitance substrate. If the resistance value of the first impedance layer is relatively small, a signal between the capacitance substrate is relatively weak, affecting the touch detection precision; and if the resistance value of the first impedance layer is relatively large, a relatively strong signal between the capacitance substrate can be ensured, and the touch sensitivity and the touch effect of the touch display module can be ensured. Moreover, the first impedance layer with a larger sheet resistance is located between the polarizer and the second impedance layer with a smaller sheet resistance, based on the features of the first impedance layer of the larger sheet resistance and stable structure, the possibility of a reaction between the first impedance layer and the polarizer can be reduced or completely eliminated, and stable performances of the impedance structure and the polarizer can be ensured. The second impedance layer is located on a side of the first impedance layer facing away from the polarizer and may be understood as a position closer to the bottom in the impedance structure. The sheet resistance of the second impedance layer is smaller, and a good conductivity of the second impedance layer can be ensured. Electrostatic charges generated by structures such as the first impedance layer and the polarizer may be exported through the second impedance layer, the electrostatic interference to the touch display module can be reduced, and the normal operation of the touch display module can be ensured. Therefore, the impedance structure includes multiple impedance layers with different sheet resistances, and the sheet resistance of the first impedance layer is greater than the sheet resistance of the second impedance layer so that stable structures of the impedance structure and the polarizer can be ensured based on that the high touch precision and the good electrostatic conduction effect are considered at the same time, thereby ensuring the stable structure and functions of the entire touch display module.

Figure 2:
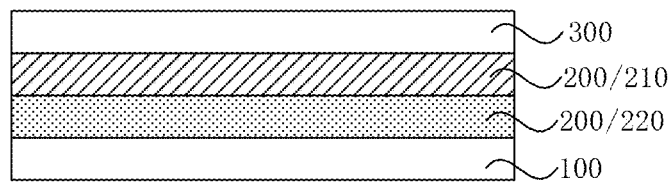
FIG. 2 is a diagram illustrating the structure of a touch display module according to an embodiment of the present disclosure.
Figure 3:
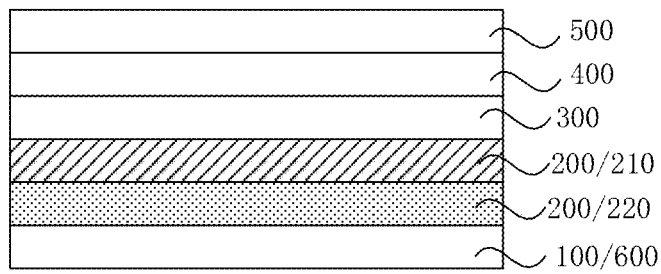
FIG. 3 is a diagram illustrating the structure of another touch display module according to an embodiment of the present disclosure.

FIG. 2 is a diagram illustrating the structure of a touch display module according to an embodiment of the present disclosure. FIG. 3 is a diagram illustrating the structure of another touch display module according to an embodiment of the present disclosure. Referring to FIGS. 2 and 3, embodiments of the present disclosure provide a touch display module 10. The touch display module 10 includes a touch display panel 100 and an impedance structure 200 and a polarizer 300 that are sequentially disposed on a light emission side of the touch display panel 100. The impedance structure 200 includes a first impedance layer 210 and a second impedance layer 220. The first impedance layer 210 is located on a side of the second impedance layer 220 facing away from the touch display panel 100. A sheet resistance of the first impedance layer 210 is greater than a sheet resistance of the second impedance layer 220.

Referring to FIG. 2, the touch display module 10 includes the touch display panel 100 and the polarizer 300. The touch display panel 100 may be of a liquid crystal type or an organic light emission type. In an embodiment, according to different types of the touch display panel 100, the polarizer 300 located on the light emission side of the touch display panel 100 may have different functions. Using the touch display panel 100 of the liquid crystal type as an example, the polarizer 300 located on the light emission side of the touch display panel 100 and a polarizer (which is not shown in the drawings) located on a light incidence side of the touch display panel 100 cooperate to achieve the normal light emission display of the touch display panel 100 of the liquid crystal type. Using the touch display panel 100 of the organic light emission type as an example, the polarizer 300 located on the light emission side of the touch display panel 100 is configured to reduce external ambient light incident on the interior of the touch display panel 100, thereby reducing the interference of the external ambient light to the normal display light emission of the touch display panel 100 and improving the display effect of the touch display panel 100.

The touch display module 10 further includes the impedance structure 200 located on the light emission side of the touch display panel 100, and the impedance structure 200 is located on a side of the polarizer 300 facing the touch display panel 100. The impedance structure 200 has conductivity. On one hand, an electrostatic charge generated by the touch display module 10 can be exported to ensure the stability and reliability of the touch display module 10; and on the other hand, the impedance structure 200 may be equivalent to a dielectric layer, it can be ensured that a transmitted touch signal cannot be shielded, thereby ensuring the touch effect of the touch display module 10. Exemplarily, the impedance structure 200 may be a film structure including a high resistance film.

Referring to FIG. 2, the impedance structure 200 includes the first impedance layer 210 and the second impedance layer 220, and the first impedance layer 210 is located on the side of the second impedance layer 220 facing away from the touch display panel 100, which may be understood as that the first impedance layer 210 is closer to the polarizer 300 than the second impedance layer 220. Further, the sheet resistance of the first impedance layer 210 is greater than the sheet resistance of the second impedance layer 220, which may be understood as that the first impedance layer 210 has a larger resistance while the second impedance layer 220 has a better conductivity. The first impedance layer 210 with a larger resistance value is equivalent to a dielectric layer between the main touch body and the touch display module 10 and may increase the intensity of a touch sense signal between the main touch body and the touch display module 10. Moreover, the first impedance layer 210 with a larger sheet resistance is located between the polarizer 300 and the second impedance layer 220 with a smaller sheet resistance, based on the features of the first impedance layer 210 of the large sheet resistance and stable structure, the possibility of a reaction between the first impedance layer 210 and the polarizer 300 can be reduced or completely eliminated, and the stable performances of the impedance structure 200 and the polarizer 300 can be ensured. The second impedance layer 220 with a better conductivity can ensure the good conduction of electrostatic charges generated in the touch display module 10, and the operation stability of the touch display module 10 can be ensured.

In an embodiment, the first impedance layer 210 is closer to the polarizer 300. If the first impedance layer 210 is composed of metal oxide, in a case of ensuring a higher resistance value of the first impedance layer 210, the number of generated oxygen vacancies is smaller so that an interface reaction cannot be generated between the first impedance layer 210 and the polarizer 300, or less interface reactions can be generated between the first impedance layer 210 and the polarizer 300, thereby ensuring a stable transmission of the touch sense signals and the overall touch effect of the touch display module 10.

Referring to FIG. 3, the touch display module 10 may further include a glass cover plate 500 and an adhesive 400 on one side of the polarizer 300 facing away from the touch display panel 100, where the adhesive 400 is configured to adhere the polarizer 300 and the glass cover plate 500. The touch display module 10 may further include other film structures that are not enumerated in the embodiment of the present disclosure.

In conclusion, the impedance structure of the touch display module provided in embodiments of the present disclosure is a multilayer structure. The sheet resistance of the first impedance layer is larger so that a stronger touch signal between the main touch body and the touch display module can be ensured, and the touch sensitivity and the touch effect of the touch display module can be ensured. The sheet resistance of the second impedance layer is smaller, and the good conductivity of the second impedance layer can be ensured. Static electricity in the touch display module may be well conducted through the second impedance layer, reducing the electrostatic interference to the touch display module and ensuring the normal operation of the touch display module. The impedance structure includes multiple impedance layers with different sheet resistances, and the sheet resistance of the first impedance layer is greater than the sheet resistance of the second impedance layer so that stable structures of the impedance structure and the polarizer can be ensured on the basis of ensuring the balance of the high touch precision and the good electrostatic conduction effect, thereby ensuring the stable structure and functions of the entire touch display module.

With continued reference to FIGS. 2 and 3, the first impedance layer 210 and the second impedance layer 220 each include a metal oxide layer, and the content of interstitial oxygen atoms in the first impedance layer 210 is less than the content of interstitial oxygen atoms in the second impedance layer 220.

The metal oxide layer includes interstitial oxygen atoms. An interstitial atom refers to a free atom that exists in some interstices in a lattice. Further, the impedance structure 200 including the metal oxide layer is generally prepared using a magnetron sputtering technique. In a preparation process, a difference in the content of interstitial oxygen atoms is caused by different introduced oxygen contents. Further, when the content of interstitial oxygen atoms in the metal oxide layer is relatively low, that is, the content of free oxygen atoms that may undergo interface reactions is relatively low, the probability of an interface reaction between the metal oxide layer and another film at an interface is reduced. In an embodiment, the content of interstitial oxygen atoms in the first impedance layer 210 is less than the content of interstitial oxygen atoms in the second impedance layer 220, and the first impedance layer 120 is located on the side of the second impedance layer 220 facing the polarizer 300, so that the probability of an interface reaction between the first impedance layer 210 and the polarizer 300 can be reduced by reducing the content of interstitial oxygen atoms in the first impedance layer 210, thereby reducing the oxygen vacancies generated by the first impedance layer 210 due to the interface reaction. When water and moist in the polarizer 300 are exposed to a high temperature or prolonged sunlight, an antistatic agent included in the polarizer 300 has an ionic liquid dissolution. An ionic solution is understood as a salt that is in a liquid state at or near room temperature and is completely composed of anions and cations, and the ionic solution may also be called a low-temperature molten salt. The ionic solution has certain adsorbability to the oxygen atoms, thus an interface reaction is generated at the interface between the polarizer and the impedance structure. Exemplarily, the antistatic agent may include bis(trifluoromethane) sulfonimide. Further, the resistance value of the first impedance layer 210 may not be decreased due to too many generated oxygen vacancies, thereby ensuring the relatively strong touch signal between the main touch body and the touch display module 10 and the touch sensitivity and the touch effect of the touch display module 10.

Further, a difference in the interstitial oxygen atoms of the metal oxide layer may be achieved according to a difference in the introduced oxygen flux in the preparation of the metal oxide layer. If a lower oxygen flux is introduced in the preparation of the impedance structure 200, no interstitial oxygen atoms or very few interstitial oxygen atoms exist in the prepared metal oxide layers. In this manner, the degree of a reaction between the impedance structure 200 and the polarizer 300 under high temperature and high-sunlight intensity conditions can be reduced, generated oxygen vacancies can be reduced, and no decrease in the resistance value of the impedance structure 200 can be ensured.

Figure 4:
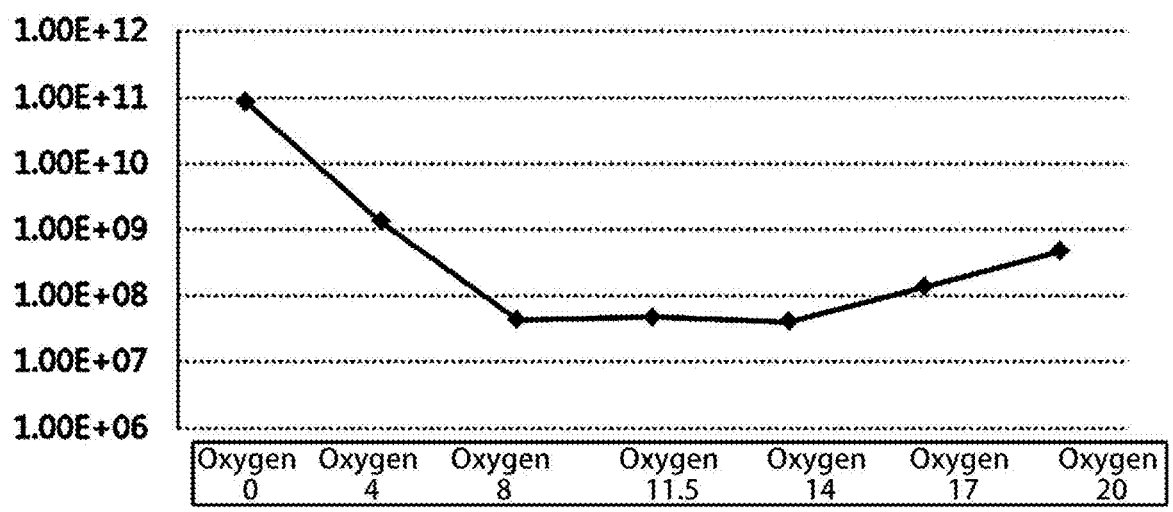
FIG. 4 is a graph of a sheet resistance of an impedance structure under different oxygen fluxes according to an embodiment of the present disclosure.

In an embodiment, the first impedance layer 210 is configured to ensure the intensity of the touch sense signal between the main touch body and the touch display module 10 so that the resistance value of the first impedance layer 210 needs to be ensured. Through extensive experimental verifications, different oxygen fluxes are introduced so that a difference exists in prepared first impedance layers 210. Different first impedance layers 210 are configured to ensure different degrees of attenuation of the corresponding touch sense signals between the main touch body and the touch display module 10. In an embodiment, the impedance of the first impedance layer 120 prepared by introducing a higher oxygen flux is smaller to ensure a larger degree of attenuation of the corresponding touch sense signals. It is to be understood that the higher the oxygen flux introduced into the prepared first impedance layer 210, the smaller the resistance value of the first impedance layer 210, so the touch sense amount is affected. In the case of ensuring the touch effect of the touch display module 10, when the first impedance layer 210 is prepared, the oxygen flux may be reduced to ensure a smaller degree of attenuation of the amount of touch signals. FIG. 4 is a graph of a sheet resistance of an impedance structure under different oxygen fluxes according to an embodiment of the present disclosure. Referring to FIGS. 2 to 4, the sheet resistance R1 of the first impedance layer 210 satisfies that $1.0*10^8 \Omega \leq R1 \leq 1.0*10^{11} \Omega$; and the sheet resistance R2 of the second impedance layer 220 satisfies that $1.0*10^7 \Omega \leq R2 < 1.0*10^8 \Omega$.

In an embodiment, the first impedance layer 210 is configured to ensure stronger touch signals between the main touch body and the touch display module 10, and the second impedance layer 220 is configured to ensure the conduction of static electricity generated by the touch display module 10. Based on a functional difference between the first impedance layer 210 and the second impedance layer 220, the resistance value of the first impedance layer 210 needs to be greater than the resistance value of the second impedance layer 220, that is, the sheet resistance R1 of the first impedance layer 210 is greater than the sheet resistance R2 of the second impedance layer 220, thereby ensuring the touch effect and the anti-interference ability of the touch display module 10.

In FIG. 4, the horizontal coordinate denotes the oxygen content introduced during the film formation of the prepared impedance structure, and the longitudinal coordinate denotes the value of the corresponding sheet resistance. Further, the sheet resistance R1 of the first impedance layer 210 may satisfy that $1.0*10^8 \Omega \leq R1 \leq 1.0*10^{11} \Omega$. It can be seen from FIG. 4 that when the first impedance layer 210 is prepared, the introduced oxygen flux may range from 0 sccm to 8 sccm. In practice, sccm is a volumetric flow rate unit and may be understood as the amount of an introduced air flow rate per unit volume. The sheet resistance R2 of the second impedance layer 220 may satisfy that $1.0*10^7 \Omega < R2 < 1.0*10^8 \Omega$. Similarly, it can also be seen from FIG. 4 that when the second impedance layer 220 is prepared, the introduced oxygen flux may range from 8 sccm to 14 sccm. The introduced oxygen gas flow rate during the preparation process of the impedance layer is reasonably controlled so that the first impedance layer 210 can be ensured to have a larger impedance, ensuring the stronger touch signals between the main touch body and the touch display module 10. Meanwhile, the second impedance layer can be ensured to have a smaller impedance, that is, a good conductivity, to ensure the conduction of static electricity generated by the touch display module 10.

Figure 5:
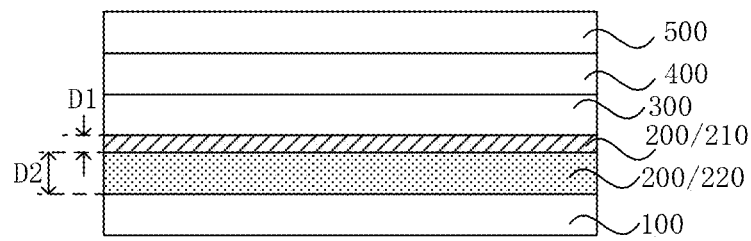
FIG. 5 is a diagram illustrating the structure of another touch display module according to an embodiment of the present disclosure.
Figure 6:
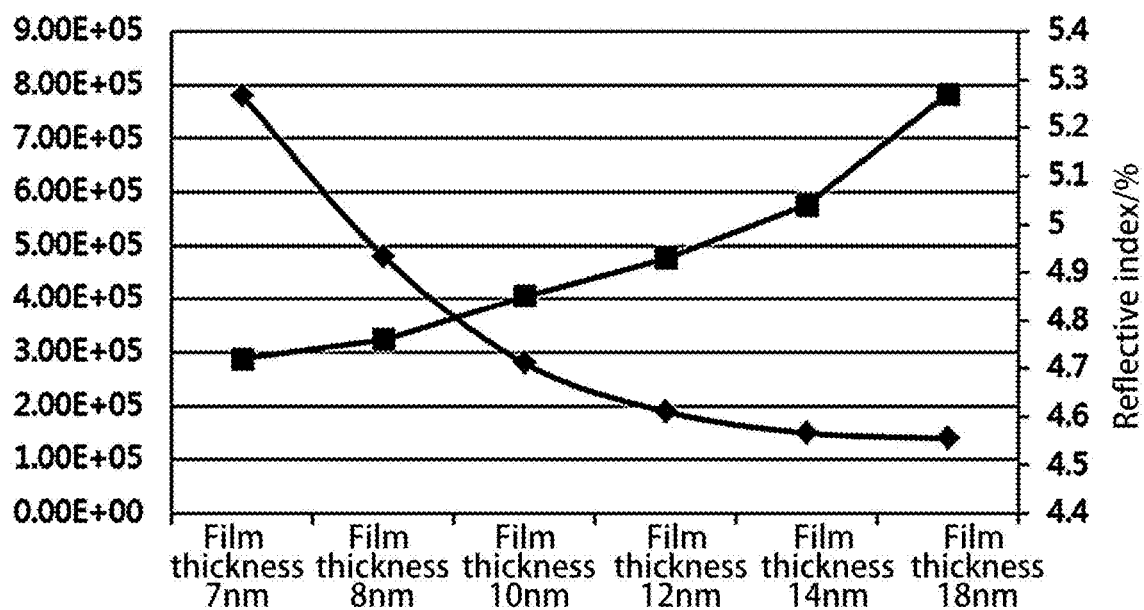
FIG. 6 is a graph of a reflective index and a sheet resistance of an impedance structure under different film thicknesses according to an embodiment of the present disclosure.

FIG. 5 is a diagram illustrating the structure of another touch display module according to an embodiment of the present disclosure. FIG. 6 is a graph of a reflective index and a sheet resistance of an impedance structure under different film thicknesses according to an embodiment of the present disclosure. Referring to FIGS. 5 and 6, the thickness of the first impedance layer 210 is less than the thickness of the second impedance layer 220.

Referring to FIG. 6, as the film thickness of the impedance structure 200 is increased, the corresponding reflective index is also increased; as the film thickness of the impedance structure 200 is increased, the corresponding sheet resistance is decreased, that is, the conductivity gets better; and as the film thickness of the impedance structure 200 is decreased, the corresponding sheet resistance is increased, that is, the resistance value is also increased.

Further, the first impedance layer 210 is located on the side of the second impedance layer 220 facing the polarizer 300, that is, the first impedance layer 120 is far away from the light emission side of the touch display panel 100. In a case where the reflective index of the first impedance layer 210 is relatively low, the reflective situation of external light in the impedance structure 200 can be effectively weakened, facilitating the reduction in the interference of the external ambient light to the normal display light emission of the touch display module and the improvement in the display effect of the touch display module 10. Meanwhile, in a case where the first impedance layer 210 has a relatively large sheet resistance, the relatively strong touch signals between the main touch body and the touch display module 10 can also be ensured. Therefore, for the first impedance layer 210, the thickness of the first impedance layer 210 is selected to be smaller in terms of the reflective index and the sheet resistance.

Further, the static electricity within the touch display module 10 may be well conducted through the second impedance layer 220, reducing the interference of the static electricity to the touch display module 10 and ensuring the normal operation of the touch display module 10, so the conductivity of the second impedance layer 220 is required to be relatively good, and the sheet resistance of the second impedance layer 220 needs to be smaller. Moreover, the second impedance layer 220 is far away from the polarizer 300 compared with the first impedance layer 210, so the second impedance layer 220 does not have a too high requirement on the reflective index. Therefore, the thickness of the second impedance layer 220 is selected to be larger.

With continued reference to FIGS. 5 and 6, the thickness D1 of the first impedance layer 210 satisfies that 2 nm≤D1≤12 nm, and the thickness D2 of the second impedance layer 220 satisfies that 12 nm<D2≤18 nm.

In an embodiment, on the premise of a lower reflective index and a larger sheet resistance, the first impedance layer 210 has a smaller thickness. As shown in FIG. 6, the thickness D1 of the first impedance layer 210 is less than or equal to 12 nm. Further, since during a preparation process of the first impedance layer 210, the difficulty and cost of the preparation process need to be considered, and the thickness of the first impedance layer 210 cannot be too small, the thickness D1 of the first impedance layer 210 may satisfy that 2 nm≤D1≤12 nm. For example, the thickness of the first impedance layer 210 may be 2 nm, 3 nm, 4.5 nm, 6.7 nm, 8 nm, 9 nm, 10.2 nm, 11 nm, or 12 nm.

Further, the second impedance layer 220 has a larger thickness while satisfying the requirement of a larger sheet resistance. As shown in FIG. 6, the thickness D2 of the second impedance layer 220 is greater than or equal to 12 nm. Further, since it is considered that the overall thickness of the prepared entire touch display module 10 should not be too large, facilitating a thinner design of the touch display module 10, meanwhile, the difficulty and cost of the preparation process also need to be considered, the thickness D2 of the second impedance layer 220 may satisfy that 12 nm<D2≤18 nm. For example, the thickness of the second impedance layer 220 may be 12 nm, 13 nm, 13.8 nm, 14.5 nm, 15 nm, 15.5 nm, 16 nm, 16.7 nm, 17.5 nm, or 18 nm.

Figure 7:
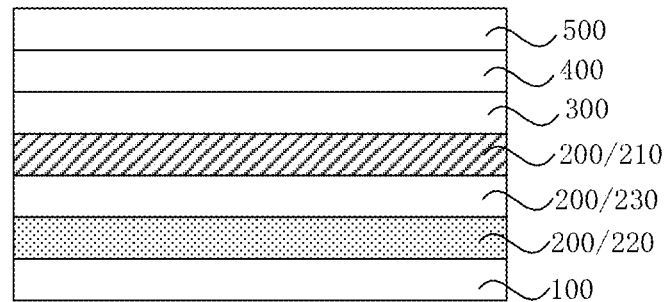
FIG. 7 is a diagram illustrating the structure of another touch display module according to an embodiment of the present disclosure.

FIG. 7 is a diagram illustrating the structure of another touch display module according to an embodiment of the present disclosure. Referring to FIG. 7, the impedance structure 200 further includes a third impedance layer 230. The third impedance layer 230 is located between the first impedance layer 210 and the second impedance layer 220 and includes a metal oxide layer. A sheet resistance of the third impedance layer 230 is less than the sheet resistance of the first impedance layer 210 and is greater than the sheet resistance of the second impedance layer 220.

Further, referring to FIG. 7, the impedance structure 200 further includes the third impedance layer 230, and the third impedance layer 230 is disposed between the first impedance layer 210 and the second impedance layer 220. The third impedance layer 230 may be understood as an adjustment film in the multilayer impedance structure 200 or a transition film in the multilayer impedance structure 200, not only can the relatively strong touch signal between the touch display module 10 and the main touch body be ensured, but also the timely conduction of the static electricity generated by the touch display module 10 and the overall display uniformity of the touch display module 10 can be ensured.

In an embodiment, the sheet resistance of the third impedance layer 230 is less than the sheet resistance of the first impedance layer 210 and is greater than the sheet resistance of the second impedance layer 220, which may be understood as that the third impedance layer 230 is equivalent to the transition layer of the sheet resistance in the entire impedance structure 200, ensuring the effect of the touch signal generated between the touch display module 10 and the main touch body. Further, the conductivity of the third impedance layer 230 is superior to the conductivity of the first impedance layer 210 and is inferior to the conductivity of the second impedance layer 220, so electrostatic charges generated by the first impedance layer 210 and generated on a side of the first impedance layer 210 facing away from the second impedance layer 220 may be timely transmitted to the second impedance layer 220 through the third impedance layer 230, which may be understood as that the third impedance layer 230 is equivalent to the transition layer for the electrostatic transmission in the entire impedance structure 200, effectively reducing the electrostatic interference to the touch display module 10 and ensuring the normal operation of the touch display module 10.

Further, if a large difference between the reflective index of the first impedance layer 210 and the reflective index of the second impedance layer 220 exists, the third impedance layer 230 is disposed between the first impedance layer 210 and the second impedance layer 220, and the reflective index of the third impedance layer 230 is set between the reflective index of the first impedance layer 210 and the reflective index of the second impedance layer 220, which may be understood as that the third impedance layer 230 is equivalent to the transition layer of the reflective index in the impedance structure 200, so that the reflective index of the impedance structure 200 can be prevented from being suddenly changed, a gradual changing optical parameter of the impedance structure 200 can be ensured, and a gradual changing inflective index cannot be cause a large impact on display, thereby ensuring the overall display uniformity of the touch display module 10 and improving the display effect of the touch display module 10.

With continued reference to FIG. 7, the content of interstitial oxygen atoms in the third impedance layer 230 is more than the content of interstitial oxygen atoms in the first impedance layer 210 and less than the content of interstitial oxygen atoms in the second impedance layer 220.

Further, the first impedance layer 210, the second impedance layer 220 and the third impedance layer 230 each include a metal oxide layer. If the content of interstitial oxygen atoms in a metal oxide layer is relatively low, that is, the content of free oxygen atoms that may undergo interface reactions is relatively low, the probability of an interface reaction between the metal oxide layer and another film at an interface is reduced so that the content of generated oxygen vacancies can be reduced, thereby ensuring an unchanged resistance value of the metal oxide layer; and if the content of interstitial oxygen atoms in a metal oxide layer is relatively high, that is, the content of free oxygen atoms that may be supplied is relatively high, which is prone to cause oxygen vacancies so that the resistance value of the metal oxide layer can be reduced, and the conductivity of the metal oxide layer can be improved.

In an embodiment, due to fitting of the first impedance layer 210 and the polarizer 300 and considering the reduction in the probability of an interface reaction between the first impedance layer 210 and the polarizer 300 and the intensity of the touch signal, the content of interstitial oxygen atoms in the first impedance layer 210 is lower. The second impedance layer 220 with a stronger conductivity is disposed to ensure that the electrostatic electricity generated by the touch display module 10 can be timely exported, so the content of interstitial oxygen atoms in the second impedance layer 220 is higher.

Further, the third impedance layer 230 is disposed between the first impedance layer 210 and the second impedance layer 220, and the third impedance layer 230 is equivalent to a transition layer between the first impedance layer 210 and the second impedance layer 220 for ensuring the electrostatic transmission, a stable touch sense signal and a uniform reflective index. The content of interstitial oxygen atoms in the third impedance layer 230 may be set between the content of interstitial oxygen atoms in the first impedance layer 210 and the content of interstitial oxygen atoms in the second impedance layer 220, ensuring the transition effect of the conductive value and resistance value. Further, an adjustment on the interstitial oxygen atoms in the first impedance layer 210, the second impedance layer 220 and the third impedance layer 230 may be achieved by adjusting the oxygen flux during the preparation of films.

With continued reference to FIGS. 4 and 7, the sheet resistance R1 of the first impedance layer 210 satisfies that $1.0*10^{10}\Omega \leq R1 \leq 1.0*10^{11}\Omega$, the sheet resistance R3 of the third impedance layer 230 satisfies that $1.0*10^{8}\Omega \leq R3 < 1.0*10^{10}\Omega$, and the sheet resistance R2 of the second impedance layer 220 satisfies that $1.0*10^{7}\Omega \leq R2 < 1.0*10^{8}\Omega$.

In an embodiment, the impedance structure 200 includes the first impedance layer 210, the second impedance layer 220 and the third impedance layer 230, and the first impedance layer 210, the second impedance layer 220 and the third impedance layer 230 are each a metal oxide layer. Since the third impedance layer 230 is equivalent to the transition layer between the first impedance layer 210 and the second impedance layer 220, the conductive value of the third impedance layer 230 is set between the conductive value of the first impedance layer 210 and the conductive value of the second impedance layer 220, and the sheet resistance value of the third impedance layer 230 is set between the sheet resistance value of the first impedance layer 210 and the sheet resistance value of the second impedance layer 220.

In FIG. 4, the horizontal coordinate denotes the oxygen content introduced during the film formation of the prepared impedance structure, and the longitudinal coordinate denotes the value of a corresponding sheet resistance. Further, the sheet resistance R1 of the first impedance layer 210 may satisfy that $1.0*10^{10}\Omega \leq R1 \leq 1.0*10^{11}\Omega$. It can be seen from FIG. 4 that when the first impedance layer 210 is prepared, the introduced oxygen flux may range from 0 sccm to 4 sccm, where sccm is a volumetric flow rate unit and may be used for reflecting the amount of the introduced air flow rate. The sheet resistance R2 of the second impedance layer 220 may satisfy that $1.0*10^{7}\Omega \leq R2 < 1.0*10^{8}\Omega$. Similarly, it can also be seen from FIG. 4 that when the second impedance layer 220 is prepared, the introduced oxygen flux may range from 8 sccm to 14 sccm. The sheet resistance R3 of the third impedance layer 230 may satisfy that $1.0*10^{8}\Omega \leq R3 < 1.0*10^{10}\Omega$. Similarly, it can also be seen from FIG. 4 that when the third impedance layer 230 is prepared, the introduced oxygen flux may range from 4 sccm to 8 sccm.

Figure 8:
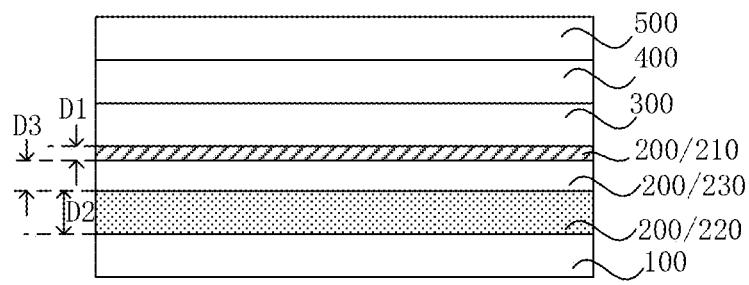
FIG. 8 is a diagram illustrating the structure of another touch display module according to an embodiment of the present disclosure.

FIG. 8 is a diagram illustrating the structure of another touch display module according to an embodiment of the present disclosure. With continued reference to FIGS. 6 and 8, the thickness of the first impedance layer 210 is less than the thickness of the third impedance layer 230, and the thickness of the third impedance layer 230 is less than the thickness of the second impedance layer 220.

It can be seen from FIG. 6 that the changing trend of the reflective index is that as the film thickness of the impedance structure 200 is increased, the corresponding reflective index is also increased. Since the first impedance layer 210 is far away from the light emission side of the touch display panel 100, it is ensured that the reflective index of the first impedance layer 210 needs to be smaller to ensure the overall display effect of the touch display module 10.

Further, it can be seen from FIG. 6 that as the film thickness of the impedance structure 200 is increased, the corresponding sheet resistance is decreased, that is, the conductivity gets better. There is a certain requirement on the conductivity of the second impedance layer 220, so a relatively good conductivity of the second impedance layer 200 may be ensured by increasing the film thickness, but the reflective index of the second impedance layer 220 gets higher correspondingly.

Further, the third impedance layer 230 is disposed between the first impedance layer 210 and the second impedance layer 220. Since a relatively large difference between the reflective index of the first impedance layer 210 and the reflective index of the second impedance layer 220 exists, to ensure the overall display uniformity of the touch display module 10, the reflective index of the third impedance layer 230 may be set between the reflective index of the first impedance layer 210 and the reflective index of the second impedance layer 220. In terms of the corresponding relationship between the reflective index and the thickness of the impedance structure 200, the thickness of the third impedance layer 230 is set between the thickness of the first impedance layer 210 and the thickness of the second impedance layer 220 so that the reflective index of the third impedance layer 230 can be ensured to be set between the reflective index of the first impedance layer 210 and the reflective index of the second impedance layer 220, preventing the reflective index of the touch display module 10 from being suddenly changed and ensuring the overall effect of the touch display module 10.

With continued reference to FIGS. 6 and 8, the thickness D1 of the first impedance layer 210 satisfies that $2\text{ nm} \leq D1 \leq 7\text{ nm}$, the thickness D3 of the third impedance layer 230 satisfies that $7\text{ nm} < D3 \leq 10\text{ nm}$, and the thickness D2 of the second impedance layer 220 satisfies that $10\text{ nm} < D2 \leq 18\text{ nm}$.

FIG. 6 may directly illustrate the corresponding relationship between the reflective index and the sheet resistance as the thickness of the impedance structure 200 is increased.

In the case where the impedance structure 200 has the first impedance layer 210, the second impedance layer 220 and the third impedance layer 230, the first impedance layer 210 needs to satisfy the requirement on the lower reflective index, so the thickness D1 of the first impedance layer 210 is smaller. Moreover, the difficulty and cost of the preparation process need to be considered, and the thickness of the first impedance layer 210 cannot be too small, so the thickness D1 of the first impedance layer 210 may satisfy that $2\text{ nm} \leq D1 \leq 7\text{ nm}$. The second impedance layer 220 has a certain requirement on the conductivity, the overall thickness of the prepared entire touch display module 10 should not be too large to facilitate a thinner design of the touch display module 10, and meanwhile, the difficulty and cost of the preparation process also need to be considered, so the thickness D2 of the second impedance layer 220 may satisfy that $10\text{ nm} < D2 \leq 18\text{ nm}$. The reflective index of the third impedance layer 230 is ensured to be set between the reflective index of the first impedance layer 210 and the reflective index of the second impedance layer 220 so that a sudden change in the reflective index can be prevented. Correspondingly, the thickness D3 of the third impedance layer 230 may satisfy that 7 nm<D3≤10 nm.

Figure 9:
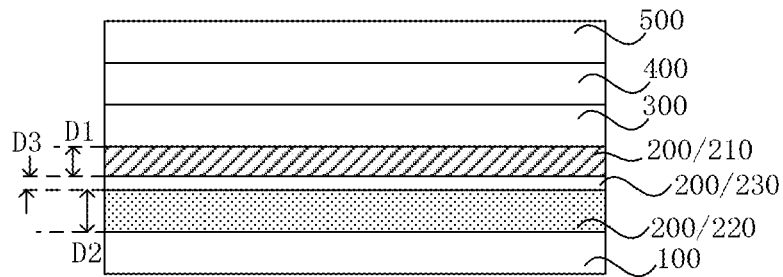
FIG. 9 is a diagram illustrating the structure of another touch display module according to an embodiment of the present disclosure.

FIG. 9 is a diagram illustrating the structure of another touch display module according to an embodiment of the present disclosure. Referring to FIG. 9, the thickness of the third impedance layer 230 is less than the thickness of the first impedance layer 210, and the thickness of the first impedance layer 210 is less than or equal to the thickness of the second impedance layer 220.

In an embodiment, the first impedance layer 210 is far away from the light emission side of the touch display panel 100, so there is a high requirement on the reflective index of the first impedance layer 210, that is, the reflective index of the first impedance layer 210 needs to be relatively low to ensure the overall display effect of the touch display module 10. Meanwhile, the resistance value of the first impedance layer 210 needs to be relatively high so as not to affect the intensity of the touch sense signal. Therefore, the thickness of the first impedance layer 210 is smaller. The second impedance layer 220 is located on the side of the first impedance layer 210 facing away from the polarizer 300, and the second impedance layer 220 is required to have a good conductivity to ensure the timely export of the electrostatic charge generated by the touch display module 10, so the thickness of the second impedance layer 220 is larger in the case where the conductivity of the second impedance layer 220 is considered.

Further, the third impedance layer 230 is disposed between the first impedance layer 210 and the second impedance layer 220 and may serve as a transition film or a buffer layer. During the preparation of different films in the impedance structure 200, different resistance values of the films can be adjusted by flexibly adjusting oxygen fluxes to satisfy different degrees of the electrostatic transmission ability of the impedance structure 200. Based on this, limitations on the third impedance layer 230 may be less than limitations on the first impedance layer 210 and limitations on the second impedance layer 220, so the preparation flexibility of the third impedance layer 230 is relatively high. Further, a smaller thickness of the third impedance layer 230 not only saves the preparation cost but also facilitates the thinner design of the touch display module 10. Exemplarily, the thickness of the first impedance layer 210 being less than the thickness of the second impedance layer 220 is illustrated in FIG. 9, but the thickness of the first impedance layer 210 may also be equal to the thickness of the second impedance layer 220, which is not limited in the embodiment.

With continued reference to FIG. 9, the thickness D3 of the third impedance layer 230 satisfies that 2 nm≤D3≤4 nm, the thickness D1 of the first impedance layer 210 satisfies that 4 nm<D1≤7 nm, and the thickness D2 of the second impedance layer 220 satisfies that 4 nm<D2 ≤12 nm.

FIG. 6 directly illustrates the corresponding relationship between the reflective index and the sheet resistance as the thickness of the impedance structure 200 is increased. In the case where the impedance structure 200 has the first impedance layer 210, the second impedance layer 220 and the third impedance layer 230, when a lower reflective index, a higher resistance value as well as the cost and difficulty of the preparation process are considered, the thickness D1 of the first impedance layer 210 may satisfy that 4 nm<D1≤7 nm. The second impedance layer 220 has a certain requirement on the conductivity, so the conductivity of the second impedance layer 220 may be enhanced by increasing the thickness, ensuring the timely export of an electrostatic charge. Moreover, the overall thickness of the prepared entire touch display module 10 should not be too large to facilitate the thinner design of the touch display module 10, and the difficulty and cost of the preparation process also need to be considered simultaneously, so the thickness D2 of the second impedance layer 220 may satisfy that 4 nm<D2≤12 nm. Since the limitations on the third impedance layer 230 may be less than the limitations on the first impedance layer 210 and the limitations on the second impedance layer 220, the preparation flexibility of the third impedance layer 230 is relatively high. The thickness of the third impedance layer 230 is set to be smaller so that the overall thinner design of the touch display module 10 can be ensured, so the thickness D3 of the third impedance layer 230 may satisfy that 2 nm≤D3≤4 nm.

Figure 10:
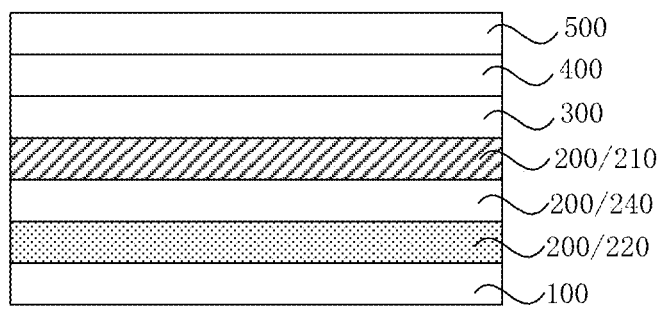
FIG. 10 is a diagram illustrating the structure of another touch display module according to an embodiment of the present disclosure.

FIG. 10 is a diagram illustrating the structure of another touch display module according to an embodiment of the present disclosure. Referring to FIG. 10, the impedance structure 200 further includes a fourth impedance layer 240. The fourth impedance layer 240 is located between the first impedance layer 210 and the second impedance layer 220 and includes a buffer layer. The refractive index of the fourth impedance layer 240 is less than the refractive index of the first impedance layer 210 and the refractive index of the second impedance layer 220.

In an embodiment, the impedance structure 200 further includes the fourth impedance layer 240, and the fourth impedance layer 240 is disposed between the first impedance layer 210 and the second impedance layer 220. Further, the first impedance layer 210 and the second impedance layer 220 each include the metal oxide layer, and the fourth impedance layer 240 includes the buffer layer, so the fourth impedance layer 240 may play a buffering role or an insulation role in the entire impedance structure 200.

Further, the refractive index of the fourth impedance layer 240 is less than the refractive index of the first impedance layer 210 and the refractive index of the second impedance layer 220. Exemplarily, the refractive index of the fourth impedance layer 240 may be close to the refractive index of glass. The specific values of the refractive indexes of different films in the impedance structure 200 are not limited in embodiments of the present disclosure. The refractive index refers to the degree of change in the direction of light when the light from one medium enters another medium. The refractive index of the fourth impedance layer 240 is smaller, and the fourth impedance layer 240 is located between the first impedance layer 210 and the second impedance layer 220, so the refractive indexes of different films of the impedance structure 200 change from a larger value to a smaller value and then to a larger value along the direction from the first impedance layer 210 to the second impedance layer 220. Since the reflective index may be reduced by passing through films with different refractive indexes during a light transmission process, the overall reflective index of the impedance structure 200 is reduced, thereby ensuring the display effect of the touch display module 10.

In an embodiment, the overall reflective index of the impedance structure 200 may also be reduced by adding the fourth impedance layer 240 in the impedance structure 200, thereby ensuring the display effect of the touch display module 10. Exemplarily, the reflective index of the impedance structure 200 with and without the addition of the fourth impedance layer 240 is tested, and the test result is described below in Table 1.

TABLE 1

The corresponding relationship between the reflective index and the film structure of the impedance structure

| Practically measured reflective index | Control experiments | Embodiments of the present disclosure |
|---|---|---|
| Impedance structure | First impedance layer Second impedance layer | First impedance layer Fourth impedance layer Second impedance layer |
| Reflective index | 5.1% | 4.8% |

It can be seen from Table 1 that the control experiments are that films of the impedance structure 200 include the first impedance layer 210 and the second impedance layer 220, and in this case, the reflective index is 5.1%, while embodiments of the present disclosure are that the films of the impedance structure 200 include the first impedance layer 210, the fourth impedance layer 240 and the second impedance layer 220 and the reflective index is 4.8% in this case. The overall reflective index is significantly decreased by adding the fourth impedance layer 240, thereby ensuring the display effect of the touch display module 10.

Meanwhile, the added fourth impedance layer 240 may also protect the second impedance layer 220. In an embodiment, the fourth impedance layer 240 added between the polarizer 300 and the second impedance layer 220 may more effectively avoid an interface reaction on the side of the second impedance layer 220 facing the polarizer 300, ensuring the overall structural stability. Further, to ensure a relatively high overall conductivity of the impedance structure 200, due to the existence of the fourth impedance layer 240, the oxygen flux may be further increased when the second impedance layer 220 is prepared, and the value of the sheet resistance of the first impedance layer 210 cannot be affected while the value of the sheet resistance of the second impedance layer 220 is decreased, ensuring the overall display effect and touch effect of the touch display module 10.

In an embodiment, the fourth impedance layer 240 may include a semiconductor oxide layer.

The fourth impedance layer 240 includes the buffer layer, and in an embodiment, the fourth impedance layer 240 includes the semiconductor oxide layer, for example, a silicon dioxide film. The layer material between the first impedance layer 210 and the second impedance layer 220 is set to be the semiconductor oxide layer. Therefore, on one hand, when the second impedance layer 220 is prepared, the oxygen flux for the second impedance layer 220 can be further increased without considering the impact on the first impedance layer 210, ensuring the flexible design of the second impedance layer 220; and on the other hand, the semiconductor oxide layer can perform electrical conduction so that it can be ensured the electrostatic charge transmitted to the first impedance layer 210 to be transmitted to the second impedance layer 220 through the fourth impedance layer 240, facilitating the timely export of electrostatic charges generated in the touch display module 10 and ensuring the stability of the touch display module 10.

Figure 11:
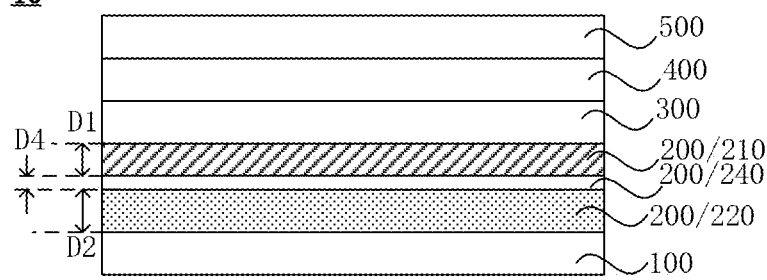
FIG. 11 is a diagram illustrating the structure of another touch display module according to an embodiment of the present disclosure.

FIG. 11 is a diagram illustrating the structure of another touch display module according to an embodiment of the present disclosure. Referring to FIG. 11, the thickness of the fourth impedance layer 240 is less than or equal to the thickness of the first impedance layer 210, and the thickness of the first impedance layer 210 is less than the thickness of the second impedance layer 220.

It can be seen from FIG. 6 that the changing trend of the reflective index is that as the film thickness of the impedance structure 200 is increased, the corresponding reflective index is also increased. Since the first impedance layer 210 is far away from the light emission side of the touch display panel 100, the reflective index of the first impedance layer 210 needs to be relatively small, thus ensuring the overall display effect of the touch display module 10. Meanwhile, as the film thickness of the impedance structure 200 is increased, the corresponding sheet resistance is decreased, that is, the conductivity gets better. There is a certain requirement on the conductivity of the second impedance layer 220, so the relatively good conductivity of the second impedance layer 220 may be ensured by increasing the film thickness, so the thickness of the first impedance layer 210 is less than the thickness of the second impedance layer 220.

Further, for the fourth impedance layer 240 serving as the buffer layer in the impedance structure 200 to adjust the reflective index and the conductive effect, the thickness of the fourth impedance layer 240 does not need to be too large, so the thickness of the fourth impedance layer 240 may be less than or equal to the thickness of the first impedance layer 210, facilitating the thinner design of the touch display module 10. Further, by thinning the fourth impedance layer 240, if the fourth impedance layer 240 is the silicon dioxide film, the content of oxygen in the fourth impedance layer 240 may be prevented from affecting the second impedance layer 220, ensuring the structural stability of the second impedance layer 220. Therefore, the thickness of the fourth impedance layer 240 is less than or equal to the thickness of the first impedance layer 210. Exemplarily, the thickness of the fourth impedance layer 240 being less than the thickness of the first impedance layer 210 is illustrated in FIG. 11, but the thickness of the first impedance layer 210 may also be equal to the thickness of the fourth impedance layer 240, which is not limited in the embodiment.

With continued reference to FIG. 11, the thickness D1 of the first impedance layer 210 satisfies that 2 nm≤D1≤10 nm, the thickness D4 of the fourth impedance layer 240 satisfies that 2 nm<D4≤10 nm, and the thickness D2 of the second impedance layer 220 satisfies that 10 nm<D2≤18 nm.

FIG. 6 directly illustrates the corresponding relationship between the reflective index and the sheet resistance as the thickness of the impedance structure 200 is increased. In the case where the impedance structure 200 has the first impedance layer 210, the second impedance layer 220 and the fourth impedance layer 240, the first impedance layer 210 and the second impedance layer 220 are the metal oxide layers, and the fourth impedance layer 240 is the buffer layer, considering the reflective index, the resistance value as well as the difficulty and cost of the process, the thickness D1 of the first impedance layer 210 may satisfy that 2 nm≤D1≤10 nm. The second impedance layer 220 has a certain requirement on the conductivity, so the conductivity of the second impedance layer 220 may be enhanced by increasing the film thickness, ensuring the timely export of the electrostatic charge. In conjunction with the preceding limitations on the sheet resistance of the second impedance layer 220, the overall thickness of the prepared entire touch display module 10 should not be too large, facilitating the thinner design of the touch display module 10, and the difficulty and cost of the preparation process also need to be considered simultaneously, so the thickness D2 of the second impedance layer 220 may satisfy that 10 nm<D2≤18 nm.

The thickness of the fourth impedance layer 240 is set to be smaller so that the overall thinner design of the touch display module 10 can be ensured, and the overall conductivity of the touch display module 10 can be better ensured, so the thickness D4 of the fourth impedance layer 240 may satisfy that 2 nm<D4≤10 nm.

With continued reference to FIGS. 2 and 3, the first impedance layer 210 includes a buffer layer, the second impedance layer 220 includes the metal oxide layer, and the refractive index of the first impedance layer 210 is greater than the refractive index of the polarizer 300 and is less than the refractive index of the second impedance layer 220.

In the impedance structure 200, the first impedance layer 210 may include the buffer layer, and the second impedance layer 220 may include the metal oxide layer. Referring to FIGS. 2 and 3, the first impedance layer 210 may effectively isolate the contact between the second impedance layer 220 and the polarizer 300 to avoid an interface reaction between the metal oxide layer and the polarizer 300, ensuring the overall structural stability of the touch display module 10.

Further, since the first impedance layer 210 is located on the side of the second impedance layer 220 facing the polarizer 300, in a case of a lower reflective index of the first impedance layer 210, the reflective situation of the external light in the impedance structure 200 can be effectively weakened, facilitating a reduction in the interference of the external ambient light to the normal display light emission of the touch display module, so the refractive index of the first impedance layer 210 is less than the refractive index of the second impedance layer 220, facilitating the improvement in the display effect of the touch display module 10.

Further, the refractive index of the first impedance layer 210 is greater than the refractive index of the polarizer 300 and is less than the refractive index of the second impedance layer 220, that is, the refractive index of the first impedance layer 210 is located between the refractive indexes of two adjacent film structures, so that a sudden change in the refractive index of the polarizer 300 and the refractive index of the impedance structure 200 can be prevented, a gradual changing optical parameter of the polarizer 300 and the impedance structure 200 can be ensured, and the gradual changing refractive index cannot cause a large impact on the display, ensuring the overall display uniformity of the touch display module 10 and improving the display effect of the touch display module 10.

Figure 12:
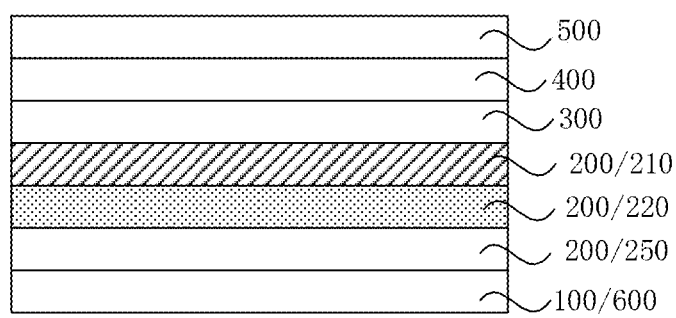
FIG. 12 is a diagram illustrating the structure of another touch display module according to an embodiment of the present disclosure.

FIG. 12 is a diagram illustrating the structure of another touch display module according to an embodiment of the present disclosure. Referring to FIG. 12, the impedance structure 200 further includes a fifth impedance layer 250. The fifth impedance layer 250 is located on a side of the second impedance layer 220 facing away from the polarizer 300 and includes a buffer layer. The touch display panel 100 includes a substrate 600 facing the impedance structure 200. The refractive index of the fifth impedance layer 250 is less than the refractive index of the second impedance layer 220 and is greater than the refractive index of the substrate 600.

In an embodiment, the impedance structure 200 further includes the fifth impedance layer 250, and the fifth impedance layer 250 is disposed on a side of the second impedance layer 220 facing away from the first impedance layer 210. Further, the first impedance layer 210 and the fifth impedance layer 250 each include the buffer layer, and the second impedance layer 220 includes the metal oxide layer. Further, referring to FIG. 12, the touch display panel 100 includes the substrate 600. It is to be noted that the touch display panel 100 includes multiple stacked film structures which are not enumerated in embodiments of the present disclosure. The touch display panel 100 in FIG. 12 denotes the substrate 600 included in the touch display panel 100.

Further, to ensure the overall display effect of the touch display module 10, the refractive indexes of different films in the impedance structure 200 may be adjusted so that the overall reflective index of the impedance structure 200 can be reduced, and the display interference of the external ambient light to the touch display module 10 can be weakened, ensuring the display effect of the touch display module 10. In an embodiment, the refractive index of the fifth impedance layer 250 is less than the refractive index of the second impedance layer 220 and is greater than the refractive index of the substrate 600, so refractive indexes of films between the substrate 600 and the second impedance layer 220 gradually increase so that the reflection of the external ambient light transmitted from the substrate side to the touch display panel 100 can be effectively reduced, ensuring the display effect of the touch display module 10. Overall, the reflection of light transmitted from one side of the polarizer 300 can be reduced, and also the reflection of light transmitted from one side of the substrate 600 can be reduced, more effectively maintaining the display effect of the touch display module 10.

Exemplarily, the overall reflective index of the impedance structure 200 may be effectively reduced by adding the fifth impedance layer 250 in the impedance structure 200, ensuring the display effect of the touch display module 10. The test result is described below in Table 2.

TABLE 2

The corresponding relationship between the reflective index and the film structure of the impedance structure

| Practically measured reflective index | Control experiments | Embodiments of the present disclosure |
| --- | --- | --- |
| Impedance structure | First impedance layer<br>Second impedance layer | First impedance layer<br>Second impedance layer<br>Fifth impedance layer |
| Reflective index | 5.1% | 4.95% |

It can be seen from Table 2 that the control experiments are that the films of the impedance structure 200 include the first impedance layer 210 and the second impedance layer 220 and that the reflective index is 5.1% in this case, and embodiments of the present disclosure are that the films of the impedance structure 200 include the first impedance layer 210, the fifth impedance layer 250 and the second impedance layer 220 and that the reflective index is 4.95% in this case. The overall reflective index is significantly decreased by adding the fifth impedance layer 250, thereby ensuring the display effect of the touch display module 10.

In an embodiment, the first impedance layer 210 may include a semiconductor oxide layer.

The first impedance layer 210 includes the buffer layer, and in an embodiment, the first impedance layer 210 includes the semiconductor oxide layer, for example, a silicon dioxide film. The semiconductor oxide layer is set on a side of the impedance structure 200 facing the polarizer 300 so that electrostatic charges accumulated by the polarizer 300 can be ensured to be transmitted to the second impedance layer 220 through the first impedance layer 210, and the static electricity generated by the touch display module 10 can be ensured to be timely exported, ensuring the touch effect and display effect of the touch display module 10. Further, when the first impedance layer 210 is the semiconductor oxide layer, an interface reaction between the second impedance layer 220 and the polarizer 300 can be effectively avoided, ensuring the overall structural stability of the touch display module 10.

Figure 13:
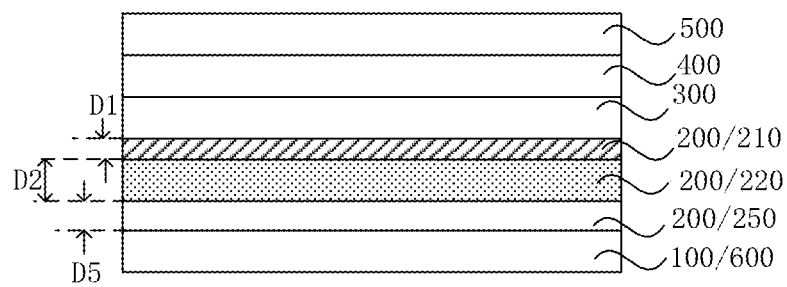
FIG. 13 is a diagram illustrating the structure of another touch display module according to an embodiment of the present disclosure.

FIG. 13 is a diagram illustrating the structure of another touch display module according to an embodiment of the present disclosure. Referring to FIG. 13, the thickness of the first impedance layer 210 is less than the thickness of the second impedance layer 220 and the thickness of the fifth impedance layer 250, and the thickness of the fifth impedance layer 250 is less than the thickness of the second impedance layer 220.

Referring to FIG. 13, the thickness of the first impedance layer 210 is less than the thickness of the second impedance layer 220 and is also less than the thickness of the fifth impedance layer 250. Since the first impedance layer 210 fits the polarizer 300, and the first impedance layer 210 may be configured to transmit electrostatic charges generated by the polarizer 300 and its upper film, the thickness of the first impedance layer 210 should not be too large. A thinner first impedance layer 210 can better ensure the transmission of the electrostatic charges.

Further, the thickness of the second impedance layer 220 is greater than the thickness of the first impedance layer 210 and greater than the thickness of the fifth impedance layer 250 at the same time. A thicker second impedance layer 220 can reduce the sheet resistance of the second impedance layer 220, thereby ensuring the conductivity of the second impedance layer 220 and also facilitating the release of the electrostatic charges.

Further, due to the requirement on the conductivity, the second impedance layer 220 has a larger thickness, so the second impedance layer 220 is greater than the fifth impedance layer 250 in terms of thickness. As an isolation layer between the second impedance layer 220 and the substrate 600, to ensure the isolation effect, the fifth impedance layer 250 may have a proper increase in thickness, and the thickness of the fifth impedance layer 250 is greater than the thickness of the first impedance layer 210.

The thickness of the first impedance layer 210, the thickness of the second impedance layer 220 and the thickness of the fifth impedance layer 250 are adjusted so that the conductivity and structural stability of the touch display module 10 can be better ensured, thereby ensuring the touch effect of the touch display module 10.

With continued reference to FIG. 13, the thickness D1 of the first impedance layer 210 satisfies that 2 nm≤D1≤4 nm, the thickness D2 of the second impedance layer 220 satisfies that 10 nm<D2≤18 nm, and the thickness D5 of the fifth impedance layer 250 satisfies that 4 nm<D5≤10 nm.

Referring to FIG. 13, due to the consideration that the first impedance layer 210 may be configured to transmit the electrostatic charges generated by the polarizer 300 and its upper film, the thickness of the first impedance layer 210 should not be too large, and when the process difficulty is considered, the thickness D1 of the first impedance layer 210 may be set to satisfy that 2 nm≤D1≤4 nm. Due to the consideration that the second impedance layer 220 with a thicker thickness may reduce the sheet resistance of the second impedance layer 220 and the consideration of the process difficulty, the thickness D2 of the second impedance layer 220 may be set to satisfy that 10 nm<D2≤18 nm. As the isolation layer between the second impedance layer 220 and the substrate 600, to ensure the isolation effect, the fifth impedance layer 250 may have a proper increase in thickness, and considering the process difficulty, the thickness D5 of the fifth impedance layer 250 may be set to satisfy that 4 nm<D5≤10 nm.

Figure 14:
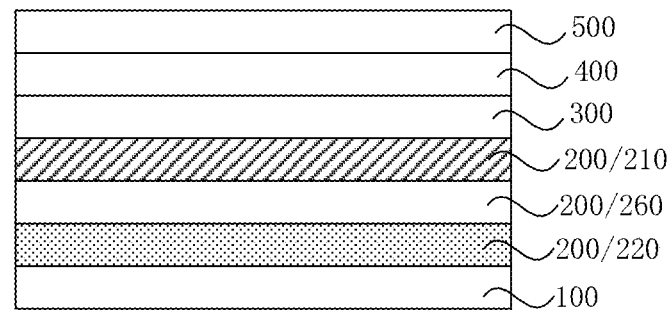
FIG. 14 is a diagram illustrating the structure of another touch display module according to an embodiment of the present disclosure.

FIG. 14 is a diagram illustrating the structure of another touch display module according to an embodiment of the present disclosure. Referring to FIG. 14, the touch display module 10 further includes a sixth impedance layer 260. The sixth impedance layer 260 is located between the first impedance layer 210 and the second impedance layer 220 and includes a metal oxide layer. The content of interstitial oxygen atoms in the sixth impedance layer 260 is less than the content of interstitial oxygen atoms in the second impedance layer 220.

In an embodiment, the impedance structure 200 further includes the sixth impedance layer 260, and the sixth impedance layer 260 is located between the first impedance layer 210 and the second impedance layer 220. Further, the first impedance layer 210 includes the buffer layer, and the second impedance layer 220 and the sixth impedance layer 260 each include the metal oxide layer.

Since the first impedance layer 210 is located on a side of the metal oxide layer facing the polarizer 300, an interface reaction between the metal oxide layer and the polarizer 300 can be avoided, ensuring the overall structural stability of the touch display module 10. Further, since the second impedance layer 220 and the sixth impedance layer 260 are metal oxide layers, the interstitial oxygen atoms exist in the second impedance layer 220 and the sixth impedance layer 260, and the content of interstitial oxygen atoms in the sixth impedance layer 260 is less than the content of interstitial oxygen atoms in the second impedance layer 220, which may be understood as that the conductivity of the sixth impedance layer 260 is less than the conductivity of the second impedance layer 220. In an embodiment, the sixth impedance layer 260 is located on the side of the second impedance layer 220 facing the polarizer 300 and has a lower content of interstitial oxygen atoms and a larger sheet resistance, so the sixth impedance layer 260 may be configured to ensure the intensity of the touch signals between the main touch body and the touch display module 10 and the touch effect of the touch display module 10. The content of interstitial oxygen atoms in the second impedance layer 220 is high, and the conductivity of the second impedance layer 200 is relatively good. The conductivity of the second impedance layer 220 is ensured so that the overall release effect of the touch display module 10 on the electrostatic charges can be ensured, and a good anti-interference capability of the touch display module 10 can be ensured, ensuring the normal operation of the touch display module 10.

Figure 15:
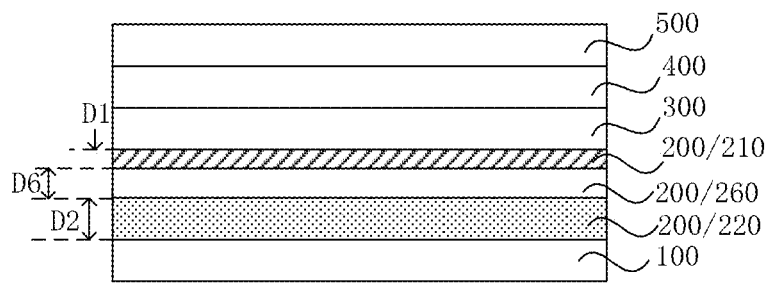
FIG. 15 is a diagram illustrating the structure of another touch display module according to an embodiment of the present disclosure.

FIG. 15 is a diagram illustrating the structure of another touch display module according to an embodiment of the present disclosure. Referring to FIG. 15, the thickness of the first impedance layer 210 is less than the thickness of the second impedance layer 220, and the thickness of the sixth impedance layer 260 is less than the thickness of the second impedance layer 220.

In an embodiment, the thickness of the first impedance layer 210 is less than the thickness of the second impedance layer 220. Since the first impedance layer 210 fits the polarizer 300, and the first impedance layer 210 may be configured to transmit the electrostatic charges generated by the polarizer 300 and its upper film, the thickness of the first impedance layer 210 should not be too large. A thinner first impedance layer 210 can better ensure the transmission of the electrostatic charges.

Further, the thickness of the second impedance layer 220 is greater than the thickness of the first impedance layer 210 and greater than the thickness of the sixth impedance layer 260 at the same time. The second impedance layer 220 with a thicker thickness can reduce the sheet resistance of the second impedance layer 220, thereby ensuring the conductivity of the second impedance layer 220 and also facilitating the release of the electrostatic charge.

Further, the thickness of the sixth impedance layer 260 is less than the thickness of the second impedance layer 220 so that a larger sheet resistance of the sixth impedance layer 260 can be ensured, and the intensity of the touch sense signal can be ensured, thereby ensuring the touch effect of the touch display module 10.

The thickness of the first impedance layer 210, the thickness of the second impedance layer 220 and the thickness of the sixth impedance layer 260 are adjusted so that the conductivity and structural stability of the touch display module 10 can be better ensured, thereby ensuring the touch effect of the touch display module 10.

With continued reference to FIG. 15, the thickness D1 of the first impedance layer 210 satisfies that 2 nm≤D1≤4 nm, the thickness D2 of the second impedance layer 220 satisfies that 10 nm≤D2≤18 nm, and the thickness D6 of the sixth impedance layer 260 satisfies that 2 nm≤D6≤4 nm.

In the case where the impedance structure 200 has the first impedance layer 210, the second impedance layer 220 and the sixth impedance layer 260, and the thickness of the first impedance layer 210 is less than the thickness of the second impedance layer 220, the thickness of the sixth impedance layer 260 is less than the thickness of the second impedance layer 220. Moreover, in conjunction with the difficulty and cost of the preparation process of the impedance structure 200, each film of the impedance structure 200 should not be prepared to be too thin or too thick. Referring to FIG. 15, the thickness D1 of the first impedance layer 210 may satisfy that 2 nm≤D1≤4 nm, the thickness D2 of the second impedance layer 220 may satisfy that 10 nm≤D2≤18 nm, and the thickness D6 of the sixth impedance layer 260 may satisfy that 2 nm≤D6≤4 nm.

Figure 16:
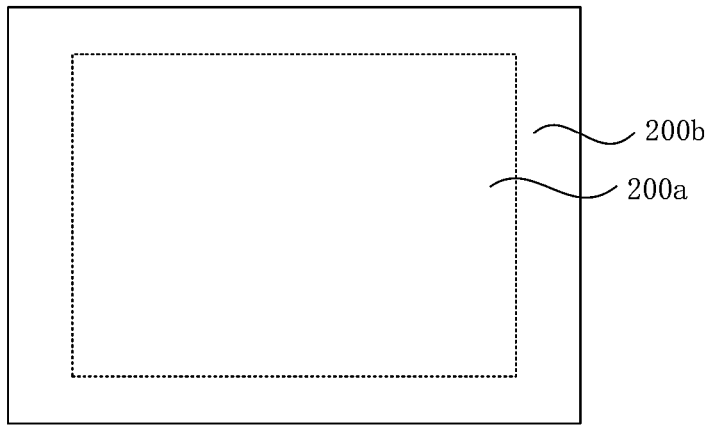
FIG. 16 is a diagram illustrating the structure of an impedance structure according to an embodiment of the present disclosure.

FIG. 16 is a diagram illustrating the structure of an impedance structure according to an embodiment of the present disclosure. Referring to FIG. 16, the impedance structure 200 includes a center impedance segment 200a and an edge impedance segment 200b. The edge impedance segment 200b surrounds the center impedance segment 200a. The first impedance layer 210 and/or the second impedance layer 220 includes the metal oxide layer. In the metal oxide layer, the content of interstitial oxygen atoms in the center impedance segment 200a is less than the content of interstitial oxygen atoms in the edge impedance segment 200b.

In an embodiment, the impedance structure 200 includes the center impedance segment 200a and the edge impedance segment 200b. Referring to FIG. 16, the edge impedance segment 200b surrounds the center impedance segment 200a. Further, the impedance structure 200 at least includes the first impedance layer 210 and the second impedance layer 220, and the first impedance layer 210 and the second impedance layer 220 may each be the metal oxide layer, or only one of the first impedance layer 210 or the second impedance layer 220 is the metal oxide layer. The impedance structure 200 including the metal oxide layer is configured to transmit or release static electricity, that is, the impedance structure 200 including the metal oxide layer is configured to transmit an electrical signal. Exemplarily, the metal oxide layer may include various conductive metal oxides and doped materials thereof, such as niobium/antimony/fluorine-doped tin oxide, aluminum-doped zinc oxide, and tin/antimony-doped indium oxide and the like. This is not limited in embodiments of the present disclosure.

Further, in the metal oxide layer, the content of interstitial oxygen atoms in the center impedance segment 200a is less than the content of interstitial oxygen atoms in the edge impedance segment 200b, that is, the conductivity of an edge region is greater than the conductivity of a center region, ensuring the electrostatic transmission stability. In an embodiment, touch failure situations of the touch display module 10 including the impedance structure 200 are generally concentrated in the center region, so the content of interstitial oxygen atoms in the center impedance segment 200a is adjusted to be less than the content of interstitial oxygen atoms in the edge impedance segment 200b in the metal oxide layer so that a region with almost no failure in the edge impedance segment 200b can be ensured to maintain a lower impedance, the good electrostatic transmission effect can be achieved and the stability of the touch display module 10 can be ensured.

With continued reference to FIG. 3, the touch display module 10 further includes a substrate 600 facing the impedance structure 200, the first impedance layer 210 contacts the polarizer 300, and the second impedance layer 220 contacts the substrate 600.

In an embodiment, the touch display module 10 includes the substrate 600, which may be understood as a substrate 600 included in the touch display panel 100. It is to be noted that the touch display panel 100 includes multiple stacked film structures which are not enumerated in embodiments of the present disclosure. The touch display panel 100 in FIG. 3 denotes the substrate 600 included in the touch display panel 100.

Further, the impedance structure 200 includes the first impedance layer 210 in contact with the polarizer 300 and the second impedance layer 220 in contact with the substrate 600, which may be understood as that the first impedance layer 210 is the uppermost impedance layer in the impedance structure 200 while the second impedance layer 220 is the lowest impedance layer in the impedance structure 200. Whether other films exist between the first impedance layer 210 and the second impedance layer 220 is not limited in embodiments of the present disclosure. The impedance structure 200 has a flexible design while the display effect and touch effect of the touch display module 10 are ensured.

Figure 17:
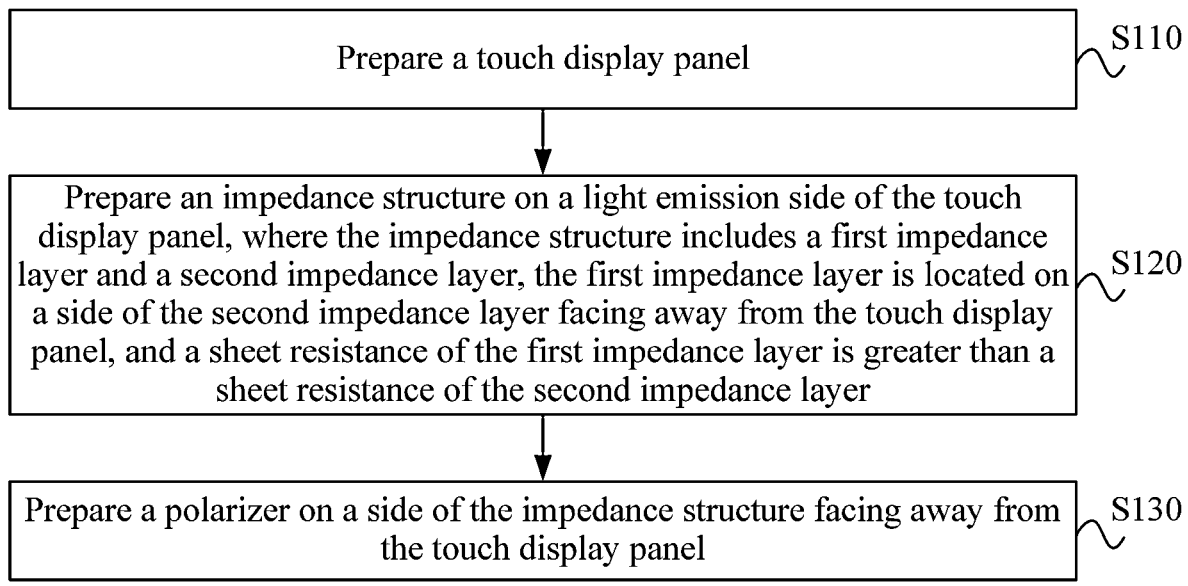
FIG. 17 is a flowchart of a preparation method for a touch display module according to an embodiment of the present disclosure.

Based on the same inventive concept, an embodiment of the present disclosure further provides a preparation method for a touch display module. FIG. 17 is a flowchart of a preparation method for a touch display module according to an embodiment of the present disclosure. Referring to FIG. 17, the preparation method includes the steps below.

In S110, a touch display panel is prepared.

In an embodiment, the touch display panel may be of a liquid crystal type or an organic light emission type, which is not limited in the embodiment of the present disclosure.

In S120, an impedance structure is prepared on a light emission side of the touch display panel. The impedance structure includes a first impedance layer and a second impedance layer, the first impedance layer is located on a side of the second impedance layer facing away from the touch display panel, and a sheet resistance of the first impedance layer is greater than a sheet resistance of the second impedance layer.

In an embodiment, the impedance structure is prepared on the light emission side of the touch display panel and has conductivity. On one hand, electrostatic charges generated by the touch display module can be exported, ensuring the stability and reliability of the touch display module; and on the other hand, the impedance structure may be equivalent to a dielectric layer, it can be ensured that transmitted touch signals cannot be shielded, and thereby the touch effect of the touch display module can be ensured. Exemplarily, the impedance structure may be a film structure including a high resistance film.

Further, the impedance structure includes the first impedance layer and the second impedance layer, and the first impedance layer is located on the side of the second impedance layer facing away from the touch display panel. Further, the sheet resistance of the first impedance layer is greater than the sheet resistance of the second impedance layer, which may be understood as that the first impedance layer has a larger resistance while the second impedance layer has a better conductivity. The first impedance layer with a larger resistance value is equivalent to a dielectric layer between the main touch body and the touch display module and may increase the intensity of touch sense signals between the main touch body and the touch display module. Meanwhile, the first impedance layer with a larger sheet resistance is located between a polarizer and the second impedance layer with a smaller sheet resistance, and based on the features of the first impedance layer of the large sheet resistance and stable structure, the possibility of a reaction between the first impedance layer and the polarizer can be reduced or completely eliminated, ensuring the stable performance of the impedance structure and the polarizer. The second impedance layer with a good conductivity can ensure the good conduction of the electrostatic charges generated in the touch display module and the operation stability of the touch display module.

In S130, a polarizer is prepared on a side of the impedance structure facing away from the touch display panel.

Further, it is continued to prepare the polarizer, and the polarizer is located on a side of the first impedance layer facing away from the second impedance layer. Exemplarily, the touch display module may further include a glass cover plate and an adhesive on a side of the polarizer facing away from the touch display panel, where the adhesive is configured to adhere the polarizer and the glass cover plate. The touch display module may further include other film structures that are not enumerated in the embodiment of the present disclosure.

In conclusion, in the preparation method for the touch display module provided in the embodiment of the present disclosure, the first impedance layer and the second impedance layer are prepared, and the value of the sheet resistance of the first impedance layer is adjusted to be greater than the value of the sheet resistance of the second impedance layer so that the relatively good conductivity of the second impedance layer far away from the polarizer can be ensured, that is, a good overall conductivity of the impedance structure can be ensured equivalently, which facilitates that the touch sensitivity of the touch display module and the touch effect of the touch display module can be ensured.

Figure 18:
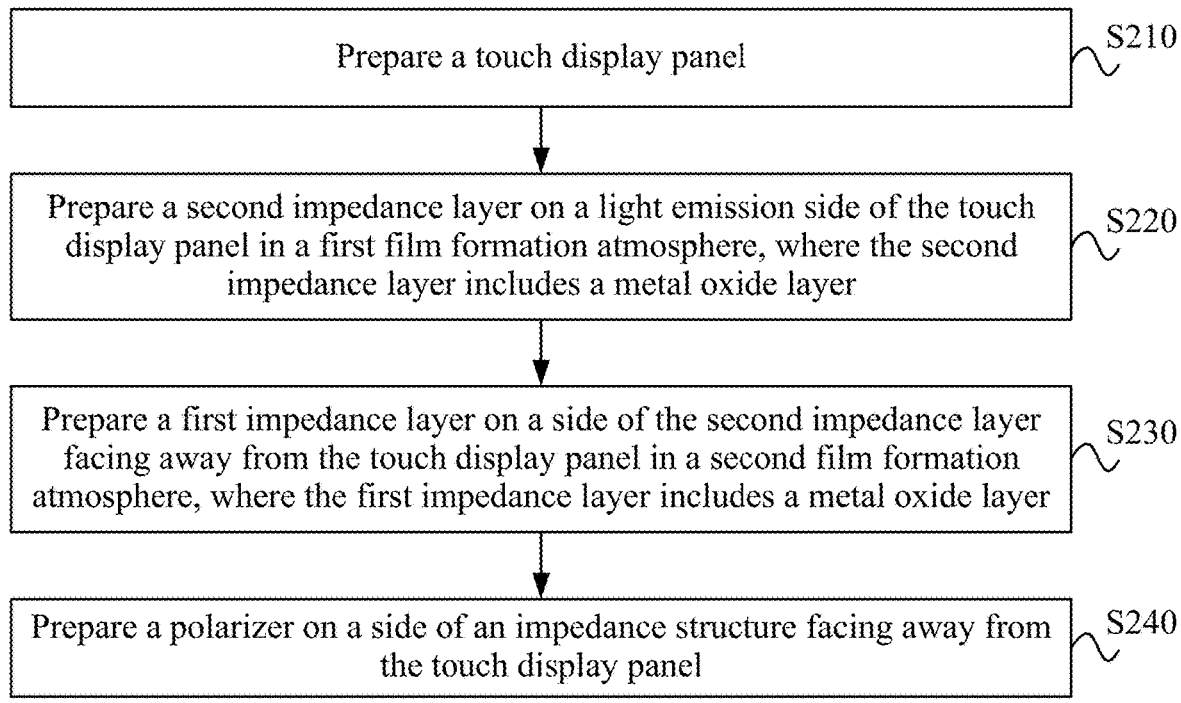
FIG. 18 is a flowchart of another preparation method for a touch display module according to an embodiment of the present disclosure.

FIG. 18 is a flowchart of another preparation method for a touch display module according to an embodiment of the present disclosure. Referring to FIG. 18, the preparation method includes the steps below.

In S210, a touch display panel is prepared.

In S220, a second impedance layer is prepared on a light emission side of the touch display panel in a first film formation atmosphere. The second impedance layer includes a metal oxide layer.

The first impedance layer and the second impedance layer that are included in an impedance structure may each be a metal oxide layer. When the second impedance layer is prepared, a magnetron sputtering manner is generally used. A certain flow rate of gas is introduced when the second impedance layer is prepared. In an embodiment, the introduced gas when the second impedance layer is prepared is oxygen, that is, the first film formation atmosphere includes oxygen.

In S230, the first impedance layer is prepared on a side of the second impedance layer facing away from the touch display panel in a second film formation atmosphere, where the first impedance layer includes a metal oxide layer.

Further, the introduced gas when the first impedance layer is prepared is still oxygen, that is, the second film formation atmosphere includes oxygen. Moreover, the gas flow rate of the oxygen in the second film formation atmosphere is less than the gas flow rate of the oxygen in the first film formation atmosphere, thereby ensuring that the content of interstitial oxygen atoms in the first impedance layer can be less than the content of interstitial oxygen atoms in the second impedance layer.

The metal oxide layer includes interstitial oxygen atoms. An interstitial atom refers to a free atom that exists in some interstices in a lattice. Further, when the content of interstitial oxygen atoms in a metal oxide layer is relatively low, that is, the content of free oxygen atoms that may undergo interface reactions is relatively low, the probability of an interface reaction between the metal oxide layer and another film at an interface is reduced. In an embodiment, the content of interstitial oxygen atoms in the first impedance layer is less than the content of interstitial oxygen atoms in the second impedance layer, and the first impedance layer is located on the side of the second impedance layer facing the polarizer, so the content of interstitial oxygen atoms in the first impedance layer may be adjusted to be lower so that the probability of the interface reaction between the first impedance layer and the polarizer can be reduced, thereby reducing oxygen vacancies generated by the first impedance layer due to the interface reaction. Further, the resistance value of the first impedance layer is not decreased because of too many generated oxygen vacancies, thereby stronger touch signal between the main touch body and the touch display module can be ensured and the touch sensitivity and the touch effect of the touch display module is ensured.

Further, a difference in the interstitial oxygen atoms of the metal oxide layer may be achieved according to a difference in the introduced oxygen flux in the preparation of the metal oxide layer. If a lower oxygen flux is introduced in the preparation of the impedance structure, no interstitial oxygen atoms or very few interstitial oxygen atoms exist in the prepared metal oxide layer. In this manner, the degree of a reaction between the impedance structure and the polarizer under high temperature and high-sunlight intensity conditions can be reduced, generated oxygen vacancies can be reduced, and no decrease in the resistance value of the impedance structure can be ensured; and if a higher oxygen flux is introduced in the preparation of the impedance structure, more interstitial oxygen atoms exist in the prepared metal oxide layer, more oxygen vacancies are generated due to the interface reaction, thereby decreasing the resistance value of the impedance structure and improving the conductivity of the impedance structure.

In S240, a polarizer is prepared on a side of an impedance structure facing away from the touch display panel.

In conclusion, the first impedance layer and the second impedance layer are controlled to be sequentially prepared in the film formation atmospheres of oxygen, and the impedance values of the first impedance layer and the second impedance layer may be flexibly adjusted by adjusting the gas flow rate of oxygen in the film formation process, a larger impedance of the first impedance layer can be ensured, which facilitates that a larger touch sense amount between the main touch body and the touch display panel can be ensured. Meanwhile, it is ensured that the second impedance layer has a smaller impedance and a good conductivity, which facilitates the smooth export of electrostatic electricity in the touch display module through the second impedance layer, the electrostatic interference to the normal operation of the touch display module can be avoided, and the good performances of the touch display module can be ensured.

Figure 19:
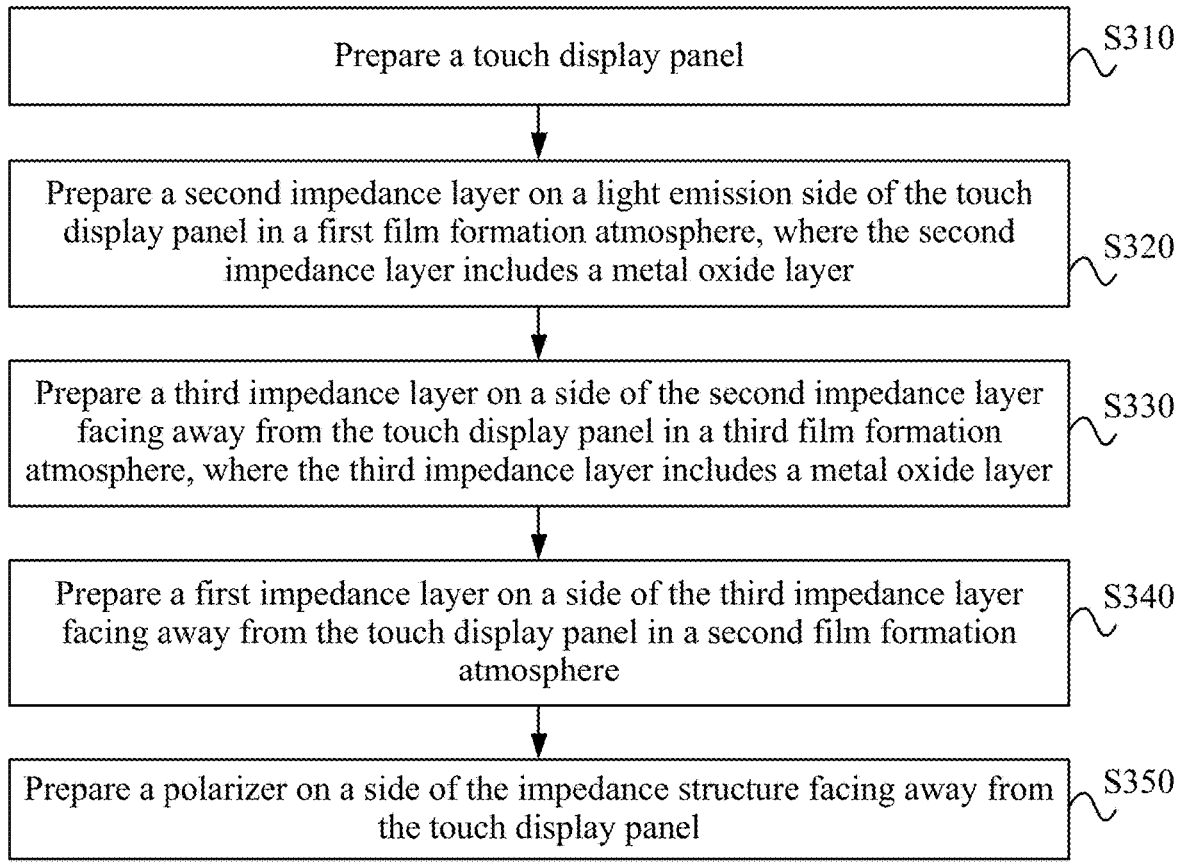
FIG. 19 is a flowchart of another preparation method for a touch display module according to an embodiment of the present disclosure.

FIG. 19 is a flowchart of another preparation method for a touch display module according to an embodiment of the present disclosure. Referring to FIG. 19, the preparation method includes the steps below.

In S310, a touch display panel is prepared.

In S320, a second impedance layer is prepared on a light emission side of the touch display panel in a first film formation atmosphere. The second impedance layer includes a metal oxide layer.

In S330, a third impedance layer is prepared on a side of the second impedance layer facing away from the touch display panel in a third film formation atmosphere. The third impedance layer includes a metal oxide layer.

In S340, a first impedance layer is prepared on a side of the third impedance layer facing away from the touch display panel in a second film formation atmosphere.

The impedance structure further includes the third impedance layer, and the third impedance layer is located on a light emission side of the second impedance layer facing away from the touch display panel. Further, the introduced gas when the third impedance layer is prepared is still oxygen, that is, the third film formation atmosphere includes oxygen. Further, the first impedance layer is prepared after the third impedance layer, and the first impedance layer is located on the side of the third impedance layer facing away from the second impedance layer. Moreover, the gas flow rate of the oxygen in the third film formation atmosphere is less than the gas flow rate of the oxygen in the first film formation atmosphere and is greater than the gas flow rate of the oxygen in the second film formation atmosphere, thereby ensuring that the sheet resistance of the third impedance layer is less than the sheet resistance of the first impedance layer and is greater than the sheet resistance of the second impedance layer. The third impedance layer may be understood as an adjustment film or a transition film in the multilayer impedance structure, and is used to ensure the strong touch signal between the touch display module and the main touch body, the timely conduction of static electricity generated by the touch display module and the overall display uniformity of the touch display module.

In an embodiment, the sheet resistance of the third impedance layer is less than the sheet resistance of the first impedance layer and is greater than the sheet resistance of the second impedance layer, it may be understood as that the third impedance layer is equivalent to the transition layer of the sheet resistance in the entire impedance structure, ensuring the effect of the touch signal generated between the touch display module and the main touch body. Further, the conductivity of the third impedance layer is superior to the conductivity of the first impedance layer and is inferior to the conductivity of the second impedance layer, so electrostatic charges generated by the first impedance layer and generated on a side of the first impedance layer facing away from the second impedance layer may be timely transmitted to the second impedance layer through the third impedance layer, which may be understood as that the third impedance layer is equivalent to the transition layer for the electrostatic transmission in the entire impedance structure, effectively reducing the electrostatic interference to the touch display module and ensuring the normal operation of the touch display module.

Further, if a large difference between the reflective index of the first impedance layer and the reflective index of the second impedance layer exists, the third impedance layer is disposed between the first impedance layer and the second impedance layer, and the reflective index of the third impedance layer is set between the reflective index of the first impedance layer and the reflective index of the second impedance layer, which may be understood as that the third impedance layer is equivalent to the transition layer of the reflective index in the impedance structure, so that a sudden change in the reflective index of the impedance structure can be prevented, the overall display uniformity of the touch display module is ensured and the display effect of the touch display module improved.

In S350, a polarizer is prepared on a side of the impedance structure facing away from the touch display panel.

In conclusion, the second impedance layer, the third impedance layer and the first impedance layer are controlled to be sequentially prepared in the film formation atmospheres of oxygen, and the impedance values of the first impedance layer, the second impedance layer and the third impedance layer may be flexibly adjusted by adjusting the gas flow rate of oxygen in the film formation process so that a larger impedance of the first impedance layer can be ensured, which facilitates that a larger touch sense amount between the main touch body and the touch display panel is ensured. Meanwhile, it is ensured that the second impedance layer has a smaller impedance and a good conductivity, which facilitates the smooth export of electrostatic electricity in the touch display module through the second impedance layer, avoiding the electrostatic interference to the normal operation of the touch display module and ensuring the good performance of the touch display module. Moreover, the third impedance layer as the adjustment film or transition film in the multilayer impedance structure is ensured to match the impedance values, reflective indexes and electrostatic transmission of the upper impedance layer and lower impedance layer.

Figure 20:
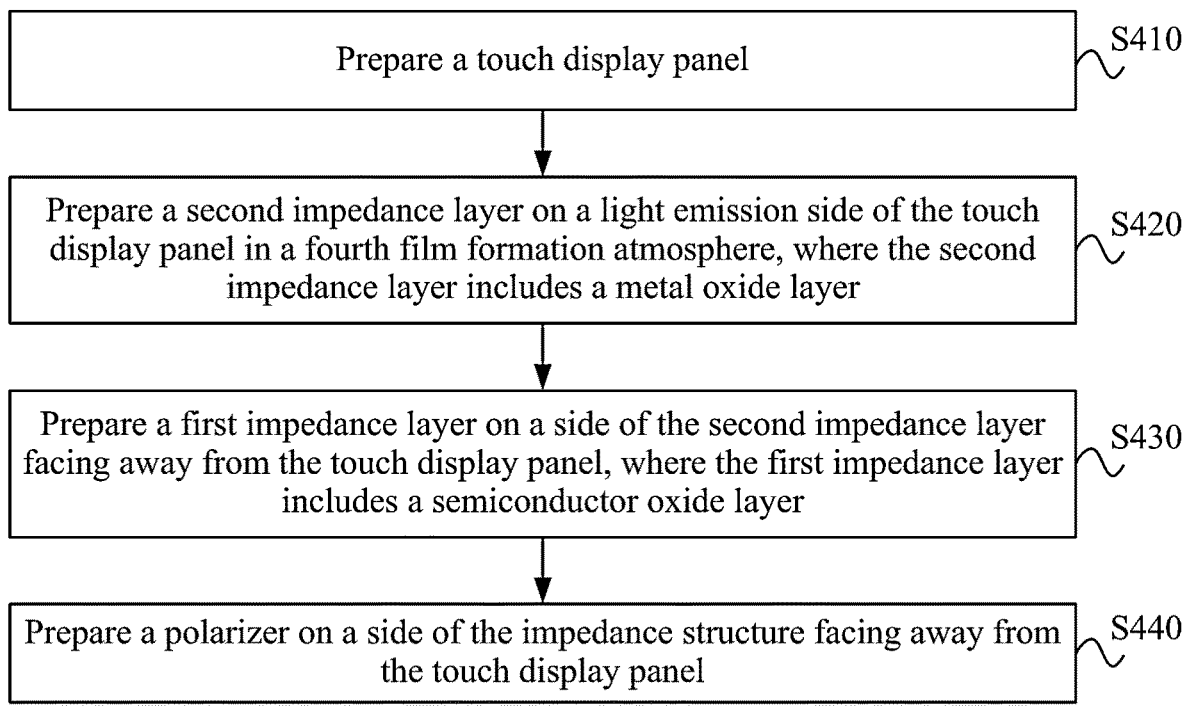
FIG. 20 is a flowchart of another preparation method for a touch display module according to an embodiment of the present disclosure.

FIG. 20 is a flowchart of another preparation method for a touch display module according to an embodiment of the present disclosure. Referring to FIG. 20, the preparation method includes the steps below.

In S410, a touch display panel is prepared.

In S420, a second impedance layer is prepared on a light emission side of the touch display panel in a fourth film formation atmosphere. The second impedance layer includes a metal oxide layer.

In an embodiment, when the second impedance layer is the metal oxide layer, the introduced gas in the preparation of the second impedance layer may be oxygen, that is, the fourth film formation atmosphere includes oxygen.

In S430, a first impedance layer is prepared on a side of the second impedance layer facing away from the touch display panel. The first impedance layer includes a semiconductor oxide layer.

In an embodiment, in the impedance structure, the first impedance layer may include the buffer layer, and the second impedance layer may include the metal oxide layer. Moreover, the first impedance layer includes the semiconductor oxide layer such as a silicon dioxide layer. The first impedance layer may effectively isolate the contact between the second impedance layer and the polarizer to avoid an interface reaction between the metal oxide layer and the polarizer, ensuring the overall structural stability of the touch display module.

In S440, a polarizer is prepared on a side of the impedance structure facing away from the touch display panel.

In conclusion, the second impedance layer and the first impedance layer including the semiconductor oxide are controlled to be prepared in the film formation atmospheres of oxygen so that the first impedance layer can effectively isolate the contact between the second impedance layer and the polarizer to avoid the interface reaction between the metal oxide layer and the polarizer, ensuring the overall structural stability of the touch display module. Moreover, the gas flow rate of oxygen in the preparation of the second impedance layer may be adjusted so that the second impedance layer can be ensured to have a smaller impedance and a good conductivity, facilitating the smooth export of static electricity in the touch display module through the second impedance layer, avoiding the electrostatic interference to the normal operation of the touch display module and ensuring the good performances of the touch display module.

Figure 21:
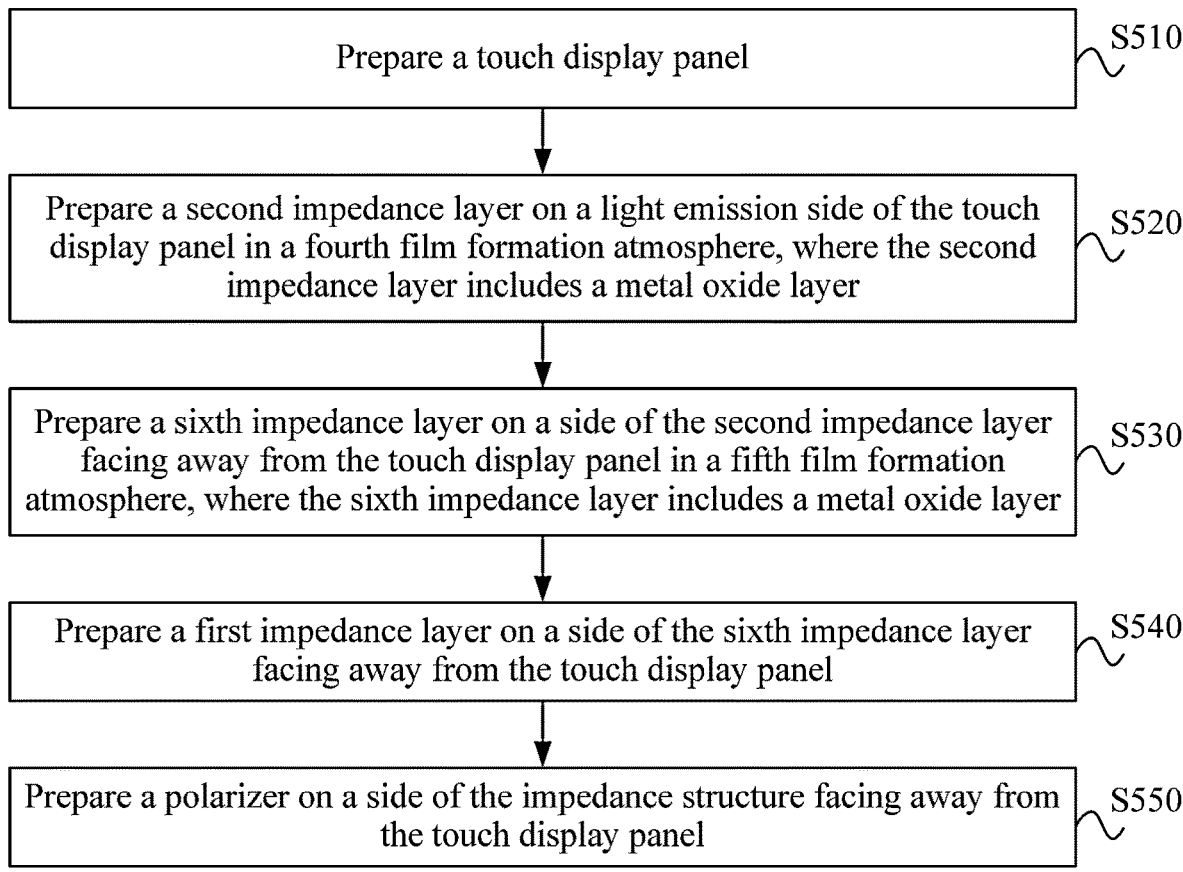
FIG. 21 is a flowchart of another preparation method for a touch display module according to an embodiment of the present disclosure.

FIG. 21 is a flowchart of another preparation method for a touch display module according to an embodiment of the present disclosure. Referring to FIG. 21, the preparation method includes the steps below.

In S510, a touch display panel is prepared.

In S520, a second impedance layer is prepared on a light emission side of the touch display panel in a fourth film formation atmosphere. The second impedance layer includes a metal oxide layer.

In S530, a sixth impedance layer is prepared on a side of the second impedance layer facing away from the touch display panel in a fifth film formation atmosphere. The sixth impedance layer includes a metal oxide layer.

In S540, a first impedance layer is prepared on a side of the sixth impedance layer facing away from the touch display panel.

In an embodiment, after the second impedance layer is prepared, the sixth impedance layer is prepared on the side of the second impedance layer facing away from the light emission side of the touch display panel, and after the sixth impedance layer is prepared, the first impedance layer is prepared on the side of the sixth impedance layer facing away from the second impedance layer. It is to be understood that the sixth impedance layer is disposed between the second impedance layer and the first impedance layer. The sixth impedance layer includes the metal oxide layer, the introduced fifth film formation atmosphere in preparation is oxygen, and the gas flow rate of the oxygen in the fifth film formation atmosphere is less than the gas flow rate of oxygen in the fourth film formation atmosphere so that the content of interstitial oxygen atoms in the sixth impedance layer can be less than the content of interstitial oxygen atoms in the second impedance layer.

Since the first impedance layer is located on the side of the metal oxide layer facing the polarizer, the first impedance layer may avoid an interface reaction between the metal oxide layer and the polarizer, ensuring the overall structural stability of the touch display module.

Further, since the second impedance layer and the sixth impedance layer are metal oxide layers, there are interstitial oxygen atoms in the second impedance layer and the sixth impedance layer, and the content of interstitial oxygen atoms in the sixth impedance layer is less than the content of interstitial oxygen atoms in the second impedance layer, which may be understood as that the conductivity of the sixth impedance layer is less than the conductivity of the second impedance layer. In an embodiment, the sixth impedance layer is located on the side of the second impedance layer facing the polarizer and has a lower content of interstitial oxygen atoms and a larger sheet resistance, so the sixth impedance layer may be configured to ensure the intensity of touch signals between the main touch body and the touch display module, ensuring the touch effect of the touch display module. The content of interstitial oxygen atoms in the second impedance layer is high, and the conductivity of the second impedance layer is relatively good. The conductivity of the second impedance layer is ensured so that the overall release effect of the touch display module on electrostatic charges can be ensured, and a relatively good anti-interference capability of the touch display module can be ensured, ensuring the normal operation of the touch display module 10.

In S550, a polarizer is prepared on a side of the impedance structure facing away from the touch display panel.

In conclusion, the second impedance layer, the sixth impedance layer and the first impedance layer including the semiconductor oxide are controlled to be sequentially prepared in the film formation atmospheres of oxygen so that the first impedance layer can effectively isolate the contact between the second impedance layer and the polarizer to avoid the interface reaction between the metal oxide layer and the polarizer, ensuring the overall structural stability of the touch display module. Moreover, the gas flow rates of oxygen in the preparation of the second impedance layer and the sixth impedance layer may be adjusted so that the second impedance layer can be ensured to have a smaller impedance and a good conductivity, facilitating the smooth export of static electricity in the touch display module through the second impedance layer, avoiding the electrostatic interference to the normal operation of the touch display module and ensuring the good performance of the touch display module. Meanwhile, the impedance of the sixth impedance layer is ensured to be greater than the impedance of the second impedance layer so that the sixth impedance layer can be configured to ensure the intensity of the touch signals between the main touch body and the touch display module, ensuring the touch effect of the touch display module.

Figure 22:
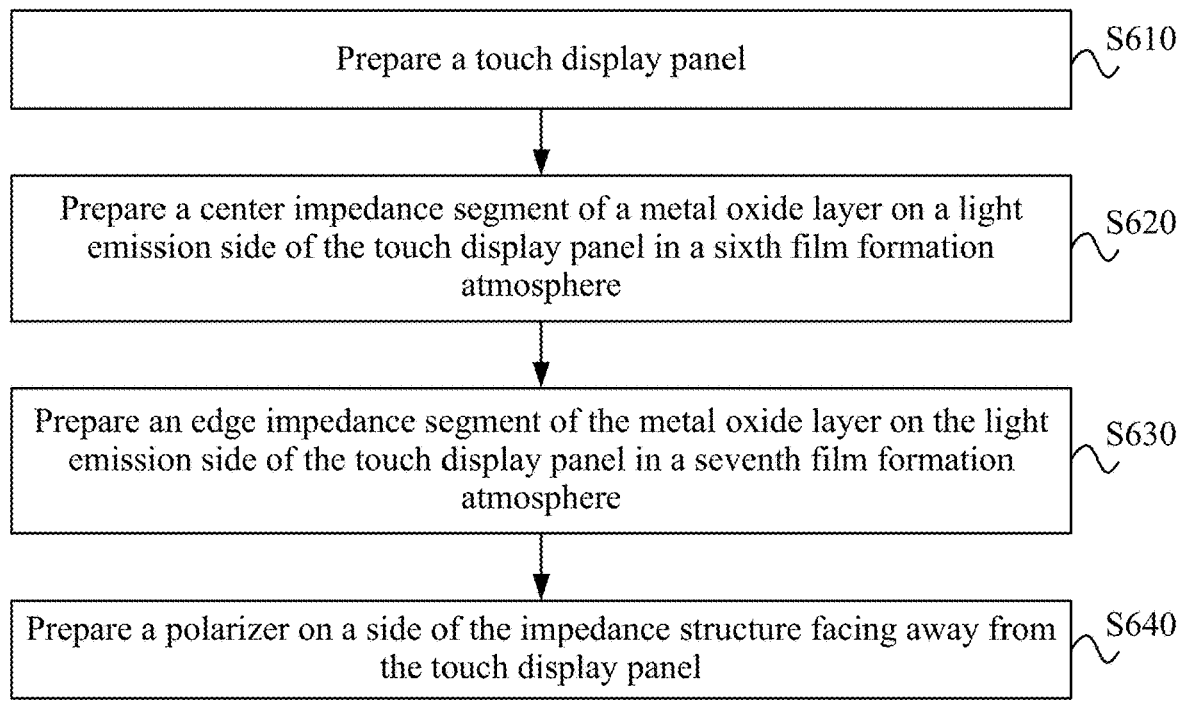
FIG. 22 is a flowchart of another preparation method for a touch display module according to an embodiment of the present disclosure.

FIG. 22 is a flowchart of another preparation method for a touch display module according to an embodiment of the present disclosure. Referring to FIG. 22, the preparation method includes the steps below.

In S610, a touch display panel is prepared.

In S620, a center impedance segment of a metal oxide layer is prepared on a light emission side of the touch display panel in a sixth film formation atmosphere.

In S630, an edge impedance segment of the metal oxide layer is prepared on the light emission side of the touch display panel in a seventh film formation atmosphere.

In an embodiment, the introduced sixth film formation atmosphere when the center impedance segment of the metal oxide layer is prepared includes oxygen, and the introduced seventh film formation atmosphere when the edge impedance segment of the metal oxide layer is prepared includes oxygen.

Further, the edge impedance segment surrounds the center impedance segment. An impedance structure including the metal oxide layer is configured to transmit or release static electricity, that is, the impedance structure including the metal oxide layer is configured to transmit an electrical signal. Exemplarily, the metal oxide layer may include various conductive metal oxides and doped materials thereof, such as niobium/antimony/fluorine-doped tin oxide, aluminum-doped zinc oxide, tin/antimony-doped indium oxide, and the like. This is not limited in the embodiment of the present disclosure.

Further, the content of interstitial oxygen atoms in the center impedance segment is less than the content of interstitial oxygen atoms in the edge impedance segment in the metal oxide layer, that is, the conductivity of the edge region is greater than the conductivity of the center region in the metal oxide layer, ensuring the electrostatic transmission stability. In an embodiment, touch failure situations of the touch display module including the impedance structure are generally concentrated in the center region, so the content of interstitial oxygen atoms in the center impedance segment is adjusted to be less than the content of interstitial oxygen atoms in the edge impedance segment in the metal oxide layer so that a region with almost no failure in the edge impedance segment can be ensured to maintain a lower impedance, the relatively good electrostatic transmission effect can be achieved and the stability of the touch display module can be ensured.

In S640, a polarizer is prepared on a side of the impedance structure facing away from the touch display panel.

In conclusion, the center impedance segment of the metal oxide layer and the edge impedance segment of the metal oxide layer are controlled to be separately prepared in the film formation atmospheres of oxygen, and the gas flow rates of oxygen in the preparation process of the center impedance segment and the edge impedance segment are adjusted so that the impedance of the center impedance segment can be larger, ensuring a larger touch amount between the main touch body and the touch display panel and the touch sensitivity. Meanwhile, the edge impedance segment is ensured to have a smaller impedance and a good conductivity, ensuring the electrostatic transmission effect and the stability of the touch display module.

Further, in conjunction with the preceding multiple embodiments of the preparation methods for a touch display module, the impedance structure prepared in the preparation method for a touch display module provided in embodiments of the present disclosure has diversity, thereby effectively satisfying diverse requirements of the touch display module.

Figure 23:
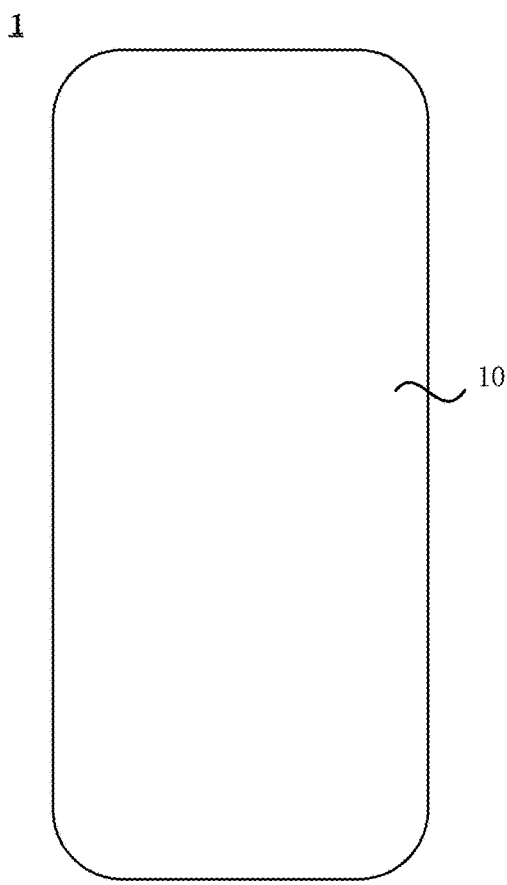
FIG. 23 is a diagram illustrating the structure of a touch display device according to an embodiment of the present disclosure.

Based on the same inventive concept, an embodiment of the present disclosure further provides a touch display device. FIG. 23 is a diagram illustrating the structure of a touch display device according to an embodiment of the present disclosure. The touch display device includes the touch display module provided in any preceding embodiment. Exemplarily, referring to FIG. 23, the touch display device 1 includes the touch display module 10. Therefore, the touch display device also has the beneficial effects of the touch display module described in the preceding embodiments. For similarities, reference may be made to the description of the preceding touch display module, and details are not repeated herein.

The touch display device 1 provided in the embodiment of the present disclosure may be a phone shown in FIG. 23, or may be any electronic product with a display function, including, but not limited to, a television, a laptop, a desktop display, a tablet computer, a digital camera, a smart bracelet, smart glasses, an in-vehicle display, industry-controlling equipment, a medical display, a touch interactive terminal and the like, which is not limited in embodiments of the present disclosure.

It is to be noted that the preceding are alternative embodiments of the present disclosure and technical principles used therein. It is to be understood by those skilled in the art that the present disclosure is not limited to the embodiments described herein. For those skilled in the art, various apparent modifications, adaptations and substitutions can be made without departing from the scope of the present disclosure. Therefore, though the present disclosure has been described in detail through the preceding embodiments, the present disclosure is not limited to the preceding embodiments and may include other equivalent embodiments without departing from the concept of the present disclosure. The scope of the present disclosure is determined by the scope of the appended claims.

What is claimed is:

1. A touch display module, comprising a touch display panel, and an impedance structure and a polarizer that are sequentially disposed on a light emission side of the touch display panel,
wherein the impedance structure comprises a first impedance layer and a second impedance layer, the first impedance layer is located on a side of the second impedance layer facing away from the touch display panel, and a sheet resistance of the first impedance layer is greater than a sheet resistance of the second impedance layer;
wherein,
the first impedance layer and the second impedance layer each comprise a metal oxide layer, and a content of interstitial oxygen atoms in the first impedance layer is less than a content of interstitial oxygen atoms in the second impedance layer, or
the first impedance layer comprises a buffer layer, the second impedance layer comprises a metal oxide layer, and a refractive index of the first impedance layer is greater than a refractive index of the polarizer and is less than a refractive index of the second impedance layer.

2. The touch display module according to claim 1, wherein the sheet resistance R1 of the first impedance layer satisfies that $1.0*10^8 \Omega \leq R1 \leq 1.0*10^{11} \Omega$; and
the sheet resistance R2 of the second impedance layer satisfies that $1.0*10^7 \Omega \leq R2 < 1.0*10^8 \Omega$.

3. The touch display module according to claim 1, wherein a thickness of the first impedance layer is less than a thickness of the second impedance layer.

4. The touch display module according to claim 1, wherein the impedance structure further comprises a third impedance layer, and the third impedance layer is located between the first impedance layer and the second impedance layer and comprises a metal oxide layer; and
a sheet resistance of the third impedance layer is less than the sheet resistance of the first impedance layer and is greater than the sheet resistance of the second impedance layer.

5. The touch display module according to claim 4, wherein a content of interstitial oxygen atoms in the third impedance layer is more than the content of interstitial oxygen atoms in the first impedance layer and is less than the content of interstitial oxygen atoms in the second impedance layer.

6. The touch display module according to claim 4, wherein the sheet resistance R1 of the first impedance layer satisfies that $1.0*10^{10} \Omega \leq R1 \leq 1.0*10^{11} \Omega$;
the sheet resistance R3 of the third impedance layer satisfies that $1.0*10^8 \Omega \leq R3 < 1.0*10^{10} \Omega$; and
the sheet resistance R2 of the second impedance layer satisfies that $1.0*10^7 \Omega \leq R2 < 1.0*10^8 \Omega$.

7. The touch display module according to claim 4, wherein a thickness of the first impedance layer is less than a thickness of the third impedance layer, and the thickness of the third impedance layer is less than a thickness of the second impedance layer.

8. The touch display module according to claim 5, wherein a thickness of the third impedance layer is less than a thickness of the first impedance layer, and the thickness of the first impedance layer is less than or equal to a thickness of the second impedance layer.

9. The touch display module according to claim 1, wherein the impedance structure further comprises a fourth impedance layer, and the fourth impedance layer is located between the first impedance layer and the second impedance layer and comprises a buffer layer; and a refractive index of the fourth impedance layer is less than both a refractive index of the first impedance layer and a refractive index of the second impedance layer.

10. The touch display module according to claim 9, wherein the fourth impedance layer comprises a semiconductor oxide layer.

11. The touch display module according to claim 9, wherein a thickness of the fourth impedance layer is less than or equal to a thickness of the first impedance layer, and the thickness of the first impedance layer is less than a thickness of the second impedance layer.

12. The touch display module according to claim 1, wherein the impedance structure further comprises a fifth impedance layer, and the fifth impedance layer is located on a side of the second impedance layer facing away from the polarizer and comprises a buffer layer; and the touch display panel comprises a substrate facing the impedance structure, and a refractive index of the fifth impedance layer is less than the refractive index of the second impedance layer and is greater than a refractive index of the substrate.

13. The touch display module according to claim 1, wherein the first impedance layer comprises a semiconductor oxide layer.

14. The touch display module according to claim 12, wherein a thickness of the first impedance layer is less than a thickness of the second impedance layer and a thickness of the fifth impedance layer; and the thickness of the fifth impedance layer is less than the thickness of the second impedance layer.

15. The touch display module according to claim 1, further comprising a sixth impedance layer, wherein the sixth impedance layer is located between the first impedance layer and the second impedance layer and comprises a metal oxide layer; and a content of interstitial oxygen atoms in the sixth impedance layer is less than a content of interstitial oxygen atoms in the second impedance layer;

wherein a thickness of the first impedance layer is less than a thickness of the second impedance layer, and a thickness of the sixth impedance layer is less than the thickness of the second impedance layer.

16. The touch display module according to claim 1, wherein the first impedance layer and the second impedance layer each comprise a center impedance segment and an edge impedance segment, and the edge impedance segment surrounds the center impedance segment;

in the metal oxide layer, a content of interstitial oxygen atoms in the center impedance segment is less than a content of interstitial oxygen atoms in the edge impedance segment.

17. The touch display module according to claim 1, further comprising a substrate facing the impedance structure, wherein the first impedance layer contacts the polarizer, and the second impedance layer contacts the substrate.

18. A touch display device, comprising a touch display module, wherein the touch display module comprises a touch display panel, and an impedance structure and a polarizer that are sequentially disposed on a light emission side of the touch display panel, wherein the impedance structure comprises a first impedance layer and a second impedance layer, the first impedance layer is located on a side of the second impedance layer facing away from the touch display panel, and a sheet resistance of the first impedance layer is greater than a sheet resistance of the second impedance layer;

wherein, the first impedance layer and the second impedance layer each comprise a metal oxide layer, and a content of interstitial oxygen atoms in the first impedance layer is less than a content of interstitial oxygen atoms in the second impedance layer, or the first impedance layer comprises a buffer layer, the second impedance layer comprises a metal oxide layer, and a refractive index of the first impedance layer is greater than a refractive index of the polarizer and is less than a refractive index of the second impedance layer.

19. The touch display device according to claim 18, wherein the sheet resistance R1 of the first impedance layer satisfies that $1.0*10^8 \Omega \leq R1 \leq 1.0*10^{11} \Omega$; and the sheet resistance R2 of the second impedance layer satisfies that $1.0*10^7 \Omega \leq R2 < 1.0*10^8 \Omega$.

20. The touch display device according to claim 18, wherein a thickness of the first impedance layer is less than a thickness of the second impedance layer.

* * * * *